(12) United States Patent
Cowell et al.

(10) Patent No.: US 7,475,316 B2
(45) Date of Patent: *Jan. 6, 2009

(54) SYSTEM, METHOD AND STORAGE MEDIUM FOR PROVIDING A HIGH SPEED TEST INTERFACE TO A MEMORY SUBSYSTEM

(75) Inventors: Thomas M. Cowell, Poughkeepsie, NY (US); Kevin C. Gower, LaGrangeville, NY (US); Frank LaPietra, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/971,578

(22) Filed: Jan. 9, 2008

(65) Prior Publication Data

US 2008/0104290 A1    May 1, 2008

Related U.S. Application Data

(63) Continuation of application No. 10/977,790, filed on Oct. 29, 2004, now Pat. No. 7,395,476.

(51) Int. Cl.
*G01R 31/28* (2006.01)
*G11C 29/00* (2006.01)
*G11C 7/00* (2006.01)
*G06F 13/00* (2006.01)

(52) U.S. Cl. .................... 714/734; 714/718; 710/71; 365/201

(58) Field of Classification Search .................. 714/734, 714/718; 710/71; 365/201
See application file for complete search history.

(56) References Cited

U.S. PATENT DOCUMENTS 2,842,682 A    7/1958    Clapper (Continued)

FOREIGN PATENT DOCUMENTS

EP        0470734 A1    2/1992

(Continued)

OTHER PUBLICATIONS

Benini, et al., "System-Level Powers Optimization: Techniques and Tools", ACM Transactions on Design Automation of Electronic Systems, vol. 5, No. 2, Apr. 2000, pp. 115-192.

(Continued)

*Primary Examiner*—Cynthia Britt
(74) *Attorney, Agent, or Firm*—Cantor Colburn LLP; Lynn Augspurger

(57) ABSTRACT

A buffer device for testing a memory subsystem. The buffer device includes a parallel bus port adapted for connection to a slow speed bus and a serial bus port adapted for connection to a high speed bus. The high speed bus operates at a faster speed than the slow speed bus. The buffer device also includes a bus converter having a standard operating mode for converting serial packetized input data received via the serial bus port into parallel bus output data for output via the parallel bus port. The buffer device also includes an alternate operating mode for converting parallel bus input data received via the parallel bus port into serial packetized output data for output via the serial bus port. The serial packetized input data is consistent in function and timing to the serial packetized output data.

19 Claims, 14 Drawing Sheets

U.S. PATENT DOCUMENTS

| | | |
|---|---|---|
| 3,333,253 A | 7/1967 | Sahulka |
| 3,395,400 A | 7/1968 | De Witt et al. |
| 3,825,904 A | 7/1974 | Burk et al. ............... 340/172.5 |
| 4,028,675 A | 6/1977 | Frankenberg ............... 711/106 |
| 4,135,240 A | 1/1979 | Ritchie |
| 4,472,780 A | 9/1984 | Chenoweth et al. |
| 4,475,194 A | 10/1984 | LaVallee et al. ............... 371/10 |
| 4,486,739 A | 12/1984 | Franaszek et al. ........... 340/347 |
| 4,641,263 A | 2/1987 | Perlman et al. |
| 4,654,857 A | 3/1987 | Samson et al. ................ 371/68 |
| 4,723,120 A | 2/1988 | Petty, Jr. ................ 340/825.02 |
| 4,740,916 A | 4/1988 | Martin ....................... 364/900 |
| 4,796,231 A | 1/1989 | Pinkham ............... 365/189.05 |
| 4,803,485 A | 2/1989 | Rypinkski ................... 370/452 |
| 4,833,605 A | 5/1989 | Terada et al. ............... 364/200 |
| 4,839,534 A | 6/1989 | Clasen ...................... 307/269 |
| 4,943,984 A | 7/1990 | Pechanek et al. ........... 375/109 |
| 4,985,828 A | 1/1991 | Shimizu et al. ............. 364/200 |
| 5,053,947 A | 10/1991 | Heibel et al. ................ 364/200 |
| 5,177,375 A | 1/1993 | Ogawa et al. |
| 5,206,946 A | 4/1993 | Brunk ........................... 710/2 |
| 5,214,747 A | 5/1993 | Cok ............................ 395/27 |
| 5,265,212 A | 11/1993 | Bruce, II .................... 710/113 |
| 5,287,531 A | 2/1994 | Rogers, Jr. et al. .......... 395/800 |
| 5,347,270 A | 9/1994 | Matsuda et al. ............ 340/2.21 |
| 5,357,621 A | 10/1994 | Cox |
| 5,375,127 A | 12/1994 | Leak et al. |
| 5,387,911 A | 2/1995 | Gleichert et al. ............... 341/95 |
| 5,394,535 A | 2/1995 | Ohuchi ....................... 711/155 |
| 5,454,091 A | 9/1995 | Sites et al. .................. 395/413 |
| 5,475,690 A | 12/1995 | Burns et al. .............. 370/105.3 |
| 5,513,135 A | 4/1996 | Dell et al. ..................... 365/52 |
| 5,517,626 A | 5/1996 | Archer et al. |
| 5,522,064 A | 5/1996 | Aldereguia et al. |
| 5,544,309 A | 8/1996 | Chang et al. ........... 395/183.06 |
| 5,546,023 A | 8/1996 | Borkar et al. |
| 5,561,826 A | 10/1996 | Davies et al. |
| 5,592,632 A | 1/1997 | Leung et al. ................ 395/306 |
| 5,594,925 A | 1/1997 | Harder et al. |
| 5,611,055 A | 3/1997 | Krishan et al. .............. 395/281 |
| 5,613,077 A | 3/1997 | Leung et al. ................ 395/306 |
| 5,627,963 A | 5/1997 | Gabillard et al. ............... 714/42 |
| 5,629,685 A | 5/1997 | Allen et al. ............ 340/825.02 |
| 5,661,677 A | 8/1997 | Rondeau, II et al. ........... 365/63 |
| 5,666,480 A | 9/1997 | Leung et al. ................ 395/180 |
| 5,684,418 A | 11/1997 | Yanagiuchi |
| 5,706,346 A | 1/1998 | Katta et al. |
| 5,764,155 A | 6/1998 | Kertesz et al. ......... 340/825.08 |
| 5,822,749 A | 10/1998 | Agarwal ........................ 707/2 |
| 5,852,617 A | 12/1998 | Mote, Jr. ..................... 714/726 |
| 5,870,325 A | 2/1999 | Nielsen et al. ................ 365/63 |
| 5,872,996 A | 2/1999 | Barth et al. ................. 395/853 |
| 5,917,760 A | 6/1999 | Millar |
| 5,926,838 A | 7/1999 | Jeddeloh .................... 711/167 |
| 5,928,343 A | 7/1999 | Farmwald et al. ........... 710/104 |
| 5,930,273 A | 7/1999 | Mukojima ................... 714/776 |
| 5,959,914 A | 9/1999 | Gates et al. |
| 5,973,951 A | 10/1999 | Bechtolsheim et al. ........ 365/52 |
| 5,974,493 A | 10/1999 | Okumura et al. ............ 710/307 |
| 5,995,405 A | 11/1999 | Trick ............................ 365/63 |
| 6,003,121 A | 12/1999 | Wirt |
| 6,011,732 A | 1/2000 | Harrison et al. |
| 6,038,132 A | 3/2000 | Tokunaga et al. ........... 361/760 |
| 6,049,476 A | 4/2000 | Laudon et al. ................. 365/52 |
| 6,076,158 A | 6/2000 | Sites et al. ................... 712/230 |
| 6,078,515 A | 6/2000 | Nielsen et al. ................ 365/63 |
| 6,081,868 A | 6/2000 | Brooks |
| 6,085,276 A | 7/2000 | VanDoren et al. |
| 6,096,091 A | 8/2000 | Hartmann .................... 716/17 |
| 6,128,746 A | 10/2000 | Clark et al. ................. 713/324 |
| 6,145,028 A | 11/2000 | Shank et al. |
| 6,170,047 B1 | 1/2001 | Dye ........................... 711/170 |
| 6,170,059 B1 | 1/2001 | Pruett et al. ................. 713/200 |
| 6,173,382 B1 | 1/2001 | Dell et al. ................... 711/170 |
| 6,185,718 B1 | 2/2001 | Dell et al. |
| 6,215,686 B1 | 4/2001 | Deneroff et al. ............... 365/52 |
| 6,219,288 B1 | 4/2001 | Braceras et al. |
| 6,219,760 B1 | 4/2001 | McMinn |
| 6,260,127 B1 | 7/2001 | Olarig et al. ................. 711/167 |
| 6,262,493 B1 | 7/2001 | Garnett |
| 6,292,903 B1 | 9/2001 | Coteus et al. ............... 713/401 |
| 6,301,636 B1 | 10/2001 | Schultz et al. .............. 711/108 |
| 6,317,352 B1 | 11/2001 | Halbert et al. ................. 365/52 |
| 6,321,343 B1 | 11/2001 | Toda .......................... 713/600 |
| 6,338,113 B1 | 1/2002 | Kubo et al. ................. 711/105 |
| 6,357,018 B1 | 3/2002 | Stuewe et al. |
| 6,370,631 B1 | 4/2002 | Dye ........................... 711/170 |
| 6,378,018 B1 | 4/2002 | Tsern et al. ................. 710/129 |
| 6,381,685 B2 | 4/2002 | Dell et al. |
| 6,393,528 B1 | 5/2002 | Arimilli et al. .............. 711/137 |
| 6,408,398 B1 | 6/2002 | Freker et al. |
| 6,442,698 B2 | 8/2002 | Nizar |
| 6,446,174 B1 | 9/2002 | Dow |
| 6,461,013 B1 | 10/2002 | Simon |
| 6,473,836 B1 | 10/2002 | Ikeda ......................... 711/137 |
| 6,477,614 B1 | 11/2002 | Leddige et al. |
| 6,483,755 B2 | 11/2002 | Leung et al. ........... 365/189.05 |
| 6,484,271 B1 | 11/2002 | Gray |
| 6,487,102 B1 | 11/2002 | Halbert et al. |
| 6,487,627 B1 | 11/2002 | Willke et al. ................. 710/306 |
| 6,493,250 B2 | 12/2002 | Halbert et al. ................. 365/63 |
| 6,496,540 B1 | 12/2002 | Widmer ...................... 375/242 |
| 6,496,910 B1 | 12/2002 | Baentsch et al. ............ 711/165 |
| 6,499,070 B1 | 12/2002 | Whetsel ....................... 710/71 |
| 6,502,161 B1 | 12/2002 | Perego et al. ................... 711/5 |
| 6,507,888 B2 | 1/2003 | Wu et al. .................... 711/105 |
| 6,510,100 B2 | 1/2003 | Grundon et al. ............. 365/233 |
| 6,513,091 B1 | 1/2003 | Blackmon et al. ........... 710/316 |
| 6,530,007 B2 | 3/2003 | Olarig |
| 6,532,525 B1 | 3/2003 | Aleksic et al. ............... 711/168 |
| 6,546,359 B1 | 4/2003 | Week ......................... 702/186 |
| 6,549,971 B1 | 4/2003 | Cecchi et al. ............... 710/306 |
| 6,553,450 B1 | 4/2003 | Dodd et al. ................. 711/105 |
| 6,557,069 B1 | 4/2003 | Drehmel et al. ............. 710/307 |
| 6,564,329 B1 | 5/2003 | Cheung et al. .............. 713/322 |
| 6,584,576 B1 | 6/2003 | Co |
| 6,587,912 B2 | 7/2003 | Leddige et al. |
| 6,590,827 B2 | 7/2003 | Chang et al. |
| 6,594,748 B1 | 7/2003 | Lin |
| 6,601,121 B2 | 7/2003 | Singh et al. ................. 710/112 |
| 6,601,149 B1 | 7/2003 | Brock et al. |
| 6,604,180 B2 | 8/2003 | Jeddeloh |
| 6,611,905 B1 | 8/2003 | Grundon et al. ............. 711/167 |
| 6,622,217 B2 | 9/2003 | Gharacorloo et al. ........ 711/141 |
| 6,625,687 B1 | 9/2003 | Halber et al. ................ 711/105 |
| 6,625,702 B2 | 9/2003 | Rentscler et al. |
| 6,628,538 B2 | 9/2003 | Funaba et al. .................. 365/63 |
| 6,631,439 B2 | 10/2003 | Saulsbury et al. |
| 6,671,376 B1 | 12/2003 | Koto et al. .................. 380/210 |
| 6,678,811 B2 | 1/2004 | Rentscler et al. ............ 711/167 |
| 6,684,320 B2 | 1/2004 | Mohamed et al. |
| 6,697,919 B2 | 2/2004 | Gharacorloo et al. ........ 711/141 |
| 6,704,842 B1 | 3/2004 | Janakiraman et al. |
| 6,721,185 B2 | 4/2004 | Dong et al. |
| 6,721,944 B2 | 4/2004 | Chaudhry et al. |
| 6,738,836 B1 | 5/2004 | Kessler et al. |
| 6,741,096 B2 | 5/2004 | Moss |
| 6,754,762 B1 | 6/2004 | Curley |
| 6,766,389 B2 | 7/2004 | Hayter et al. |
| 6,775,747 B2 | 8/2004 | Venkatraman |
| 6,779,075 B2 | 8/2004 | Wu et al. .................... 711/105 |
| 6,791,555 B1 | 9/2004 | Radke et al. |
| 6,792,495 B1 | 9/2004 | Garney et al. |
| 6,807,650 B2 | 10/2004 | Lamb et al. ..................... 716/1 |

| | | | |
|---|---|---|---|
| 6,832,286 B2 | 12/2004 | Johnson et al. | 711/105 |
| 6,834,355 B2 | 12/2004 | Uzelac | 713/300 |
| 6,839,393 B1 | 1/2005 | Sidiropoulos | 375/371 |
| 6,854,043 B2 | 2/2005 | Hargis et al. | 711/168 |
| 6,865,646 B2 | 3/2005 | David | 711/128 |
| 6,871,253 B2 | 3/2005 | Greeff et al. | 710/316 |
| 6,874,102 B2 | 3/2005 | Doody et al. | 714/5 |
| 6,877,076 B1 | 4/2005 | Cho et al. | |
| 6,877,078 B2 | 4/2005 | Fujiwara et al. | |
| 6,882,082 B2 | 4/2005 | Greeff et al. | |
| 6,889,284 B1 | 5/2005 | Nizar et al. | |
| 6,898,726 B1 | 5/2005 | Lee | |
| 6,918,068 B2 | 7/2005 | Vail et al. | |
| 6,938,119 B2 | 8/2005 | Kohn et al. | |
| 6,944,084 B2 | 9/2005 | Wilcox | |
| 6,948,091 B2 | 9/2005 | Bartels et al. | |
| 6,949,950 B2 | 9/2005 | Takahashi et al. | |
| 6,977,536 B2 | 12/2005 | Chin-Chieh et al. | 327/116 |
| 6,993,612 B2 | 1/2006 | Porterfield | |
| 7,024,518 B2 | 4/2006 | Halbert et al. | 711/115 |
| 7,039,755 B1 | 5/2006 | Helms | |
| 7,047,384 B2 | 5/2006 | Bodas et al. | |
| 7,051,172 B2 | 5/2006 | Mastronarde et al. | 711/158 |
| 7,073,010 B2 | 7/2006 | Chen et al. | 710/313 |
| 7,076,700 B2 | 7/2006 | Rieger | |
| 7,093,078 B2 | 8/2006 | Kondo | 711/141 |
| 7,096,407 B2 | 8/2006 | Olarig | 714/768 |
| 7,103,792 B2 | 9/2006 | Moon | |
| 7,113,418 B2 | 9/2006 | Oberlin et al. | 365/63 |
| 7,114,109 B2 | 9/2006 | Daily et al. | 714/724 |
| 7,127,629 B2 | 10/2006 | Vogt | 713/500 |
| 7,133,790 B2 | 11/2006 | Liou | |
| 7,133,972 B2 | 11/2006 | Jeddeloh | |
| 7,136,958 B2 | 11/2006 | Jeddeloh | 710/317 |
| 7,155,623 B2 | 12/2006 | Lefurgy et al. | 713/300 |
| 7,162,567 B2 | 1/2007 | Jeddeloh et al. | 711/154 |
| 7,165,153 B2 | 1/2007 | Vogt | 711/154 |
| 7,177,211 B2 | 2/2007 | Zimmerman | 365/201 |
| 7,181,584 B2 | 2/2007 | LaBerge | 711/167 |
| 7,194,593 B2 | 3/2007 | Schnepper | |
| 7,197,594 B2 | 3/2007 | Raz et al. | |
| 7,200,832 B2 | 4/2007 | Butt et al. | 710/17 |
| 7,206,962 B2 | 4/2007 | Deegan | |
| 7,216,196 B2 | 5/2007 | Jeddeloh | |
| 7,227,949 B2 | 6/2007 | Heegard et al. | |
| 7,234,099 B2 | 6/2007 | Gower et al. | 714/767 |
| 7,240,145 B2 | 7/2007 | Holman | |
| 7,260,685 B2 | 8/2007 | Lee et al. | 711/213 |
| 7,266,634 B2 | 9/2007 | Ware et al. | |
| 7,313,583 B2 | 12/2007 | Porten et al. | |
| 7,321,979 B2 | 1/2008 | Lee | |
| 2001/0029566 A1 | 10/2001 | Shin | |
| 2002/0019926 A1 | 2/2002 | Huppenthal et al. | 712/15 |
| 2002/0059439 A1 | 5/2002 | Arroyo et al. | |
| 2002/0103988 A1 | 8/2002 | Dornier | 712/38 |
| 2003/0009632 A1 | 1/2003 | Arimilli et al. | |
| 2003/0028701 A1 | 2/2003 | Rao et al. | |
| 2003/0033364 A1 | 2/2003 | Garnett et al. | 709/203 |
| 2003/0051055 A1 | 3/2003 | Parrella et al. | |
| 2003/0056183 A1 | 3/2003 | Kobayashi | |
| 2003/0084309 A1 | 5/2003 | Kohn | 713/189 |
| 2003/0090879 A1 | 5/2003 | Doblar et al. | 361/728 |
| 2003/0105938 A1 | 6/2003 | Cooksey et al. | |
| 2004/0049723 A1 | 3/2004 | Obara | 714/729 |
| 2004/0098549 A1 | 5/2004 | Dorst | |
| 2004/0117588 A1 | 6/2004 | Arimilli et al. | 711/203 |
| 2004/0128474 A1 | 7/2004 | Vorbach | 712/10 |
| 2004/0165609 A1 | 8/2004 | Herbst et al. | |
| 2004/0199363 A1 | 10/2004 | Bohizic et al. | |
| 2004/0230718 A1 | 11/2004 | Polzin et al. | 710/22 |
| 2004/0260909 A1 | 12/2004 | Lee et al. | |
| 2004/0260957 A1 | 12/2004 | Jeddeloh et al. | |
| 2005/0023560 A1 | 2/2005 | Ahn et al. | 257/200 |
| 2005/0044305 A1 | 2/2005 | Jakobs et al. | |
| 2005/0050237 A1 | 3/2005 | Jeddeloh et al. | 710/10 |
| 2005/0071542 A1 | 3/2005 | Weber et al. | |
| 2005/0080581 A1 | 4/2005 | Zimmerman et al. | 702/117 |
| 2005/0086441 A1 | 4/2005 | Meyer et al. | |
| 2005/0125702 A1 | 6/2005 | Huang et al. | |
| 2005/0125703 A1 | 6/2005 | Lefurgy et al. | |
| 2005/0138246 A1 | 6/2005 | Chen et al. | |
| 2005/0138267 A1 | 6/2005 | Bains et al. | 711/100 |
| 2005/0144399 A1 | 6/2005 | Hosomi | 711/145 |
| 2005/0149665 A1 | 7/2005 | Wolrich et al. | |
| 2005/0166006 A1 | 7/2005 | Talbot et al. | |
| 2005/0017767 A1 | 8/2005 | Jeddeloh | |
| 2005/0223196 A1 | 10/2005 | Knowles | |
| 2005/0248997 A1 | 11/2005 | Lee | |
| 2005/0259496 A1 | 11/2005 | Hsu et al. | 365/226 |
| 2005/0289377 A1 | 12/2005 | Luong et al. | |
| 2006/0036826 A1 | 2/2006 | Dell et al. | |
| 2006/0036827 A1 | 2/2006 | Dell et al. | |
| 2006/0080584 A1 | 4/2006 | Hartnett et al. | |
| 2006/0085602 A1 | 4/2006 | Huggahalli et al. | |
| 2006/0095592 A1 | 5/2006 | Borkenhagen | |
| 2006/0095679 A1 | 5/2006 | Edirisooriya | |
| 2006/0107175 A1 | 5/2006 | Dell et al. | |
| 2006/0112238 A1 | 5/2006 | Jamil et al. | |
| 2006/0161733 A1 | 7/2006 | Beckett et al. | |
| 2006/0195631 A1 | 8/2006 | Rajamani | |
| 2006/0288172 A1 | 12/2006 | Lee et al. | |
| 2007/0025304 A1 | 2/2007 | Leelahakriengkrai et al. | |
| 2007/0160053 A1 | 7/2007 | Coteus et al. | |

FOREIGN PATENT DOCUMENTS

| | | |
|---|---|---|
| GB | 2396711 A | 6/2004 |
| JP | 59153353 | 9/1984 |
| JP | 0432614 | 11/1992 |
| JP | 10011971 | 1/1998 |
| WO | 00/04481 A | 1/2000 |
| WO | 2005/038660 A | 4/2005 |

OTHER PUBLICATIONS

Boudon, et al., "Novel Bus Reconfiguration Scheme With Spare Lines", IBM Technical Disclosure Bulletin, May 1987, vol. 29, No. 12, pp. 1-3.

Brown, et al "Compiler-Based I/O Prefetching for Out-of-Core Applications", ACM Transactions on Computer Systems, vol. 19, No. 2, May 2001, pp. 111-170.

Ghoneima et al.; "Optimum Positioning of Interleaved Repeaters in Bidirectional Buses;" IEEE Transactions on Computer-Aided Design of Integrated Circuits and Systems, vol. 25, No. 3, Mar. 2005, pp. 461-469.

IEEE, "IEEE Standard Test Access Port and Boundary-Scan Architecture", Jul. 23, 2001, IEEE Std 1149-1-2001, pp. 11-13.

JEDEC Solid State Technology Association, "JEDEC Standard: DDR2 SDRAM Specification", Jan. 2004, JEDEC, Revision JESD79-2A, p. 10.

Jungjoon Kim et al.; "Performance and Architecture Features of Segmented Multiple Bus System;" IEEE Computer Society; Sep. 21-24, 1999 International Conference on Parallel Processing (ICPP '99).

Massoud Pedram, "Power Minimization in IC Design Principles and Applications", ACM Transactions on Design Automation of Electronic Systems vol. 1, No. 1, Jan. 1996, pp. 3-56.

Natarajan, et al., "A Study of Performance Impact of Memory Controller Features in Multi-Processor Server Environment", Jun. 2004, pp. 80-87.

NB940259 (IBM Technical Disclosure Bulletin, Feb. 1994; vol. 37; pp. 59-64).

Nilsen, "High-Level Dynamic Memory Management for Object-Oriented Real-Time Systems", Jan. 1, 1996, pp. 86-93.

P.R. Panda, "Data and Memory Optimization Techniques For Embedded Systems", ACM Transactions on Design Automation of Electronic Systems, vol. 6, No. 2, Apr. 2001, pp. 149-206.

Penrod, Lee, "Understanding System Memory and CPU Speeds: A laymans guide to the Front Side Bus (FSB)", Dec. 28, 2005, Direction . Org, pp. 1-5, http://www.directron.com/directron/fsbguide.html. [online]; [retrieved on Feb. 23, 2006]; retrieved from the Internet.

Rosenberg, "Dictionary of Computers, Information Processing & Telecommuications", Second Edition, John Wiley & Sons, Inc. 1987. 3 pgs.

Seceleanu et al.; "Segment Arbiter as Action System;" IEEE Jul. 2003 pp. 249-252.

Singh, S., et al., "Bus Sparing for Fault-Tolerant System Design", IBM Technical Disclosure Bulletin, Dec. 1991, vol. 34, No. 71, pp. 117-118.

Sivencrona et al.; "RedCAN™; Simulations of two Fault Recovery Algorithms for CAN;" Proceedings for the 10th IEEE Pacific Rim International Symposium on Dependable Computing (PRDC'04); Mar. 3-5, 2005.

U.S. Appl. No. 11/419,586, filed May 22, 2006. Robert Tremaine. "Systems and Methods for Providing Remote Pre-Fetch Buffers".

Wang, et al., "Guided Region Prefetching: A Cooperative Hardware/Software Approach", Jun. 2003, pp. 388-398.

Wikipedia, Serial Communications, [online], [retrieved Apr. 10, 2007 from the Internet], http://en.wikipedia.org/wiki/Serial_communications,p. 1.

International Search Report, International Application No. PCT/EP2007/054929, International Publication No. WO 2007/135144 A1, received Mar. 21, 2008.

PCT Search Report PCT/EP2006/068984. Mailed Feb. 9, 2007.

PCT Search Report PCT/EP2007/057915. Mailed Jul. 31, 2007.

PCT Search Report PCT/EP2007/057916. Mailed Dec. 14, 2007.

| DOWNSTREAM | | | | | | FORMAT: 9 DATA – 8 CMD – 4 ECC – 1 SPARE – 1 DIFF CLK = 24 WIRES | | | | | | | | | | | | | | | | |
|---|---|---|---|---|---|---|---|---|---|---|---|---|---|---|---|---|---|---|---|---|---|---|
| s3_us(#) d3_s3(#) | 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| Xfer/Bit | SPARE | ECC0 | ECC1 | ECC2 | ECC3 | DI0 | DI1 | DI2 | DI3 | DI4 | DI5 | DI6 | DI7 | DI8 | C0 | C1 | C2 | C3 | C4 | C5 | C6 | C7 |
| 0 | S0 | E00 | E10 | E20 | E30 | D00 | D10 | D20 | D30 | D40 | D50 | D60 | D70 | D80 | C00 | C10 | C20 | C30 | C40 | C50 | C60 | C70 |
| 1 | S1 | E01 | E11 | E21 | E31 | D01 | D11 | D21 | D31 | D41 | D51 | D61 | D71 | D81 | C01 | C11 | C21 | C31 | C41 | C51 | C61 | C71 |
| 2 | S2 | E02 | E12 | E22 | E32 | D02 | D12 | D22 | D32 | D42 | D52 | D62 | D72 | D82 | C02 | C12 | C22 | C32 | C42 | C52 | C62 | C72 |
| 3 | S3 | E03 | E13 | E23 | E33 | D03 | D13 | D23 | D33 | D43 | D53 | D63 | D73 | D83 | C03 | C13 | C23 | C33 | C43 | C53 | C63 | C73 |
| 4 | S4 | E04 | E14 | E24 | E34 | D04 | D14 | D24 | D34 | D44 | D54 | D64 | D74 | D84 | C04 | C14 | C24 | C34 | C44 | C54 | C64 | C74 |
| 5 | S5 | E05 | E15 | E25 | E35 | D05 | D15 | D25 | D35 | D45 | D55 | D65 | D75 | D85 | C05 | C15 | C25 | C35 | C45 | C55 | C65 | C75 |
| 6 | S6 | E06 | E16 | E26 | E36 | D06 | D16 | D26 | D36 | D46 | D56 | D66 | D76 | D86 | C06 | C16 | C26 | C36 | C46 | C56 | C66 | C66 |
| 7 | S7 | E07 | E17 | E27 | E37 | D07 | D17 | D27 | D37 | D47 | D57 | D67 | D77 | D87 | C07 | C17 | C27 | C37 | C47 | C57 | C67 | C67 |

SPARE BITS 1302    E: ECC CHECK BITS 1304    D: WRITE DATA BITS 1306    C: COMMAND BITS 1308

FIG. 13

SYSTEM, METHOD AND STORAGE MEDIUM FOR PROVIDING A HIGH SPEED TEST INTERFACE TO A MEMORY SUBSYSTEM

CROSS REFERENCE TO RELATED APPLICATION

This application is a continuation application of U.S. Ser. No. 10/977,790, filed Oct. 29, 2004, the contents of which are incorporated by reference herein in their entirety.

BACKGROUND OF THE INVENTION

The invention relates to testing a memory subsystem and in particular, to providing a high speed test interface to a memory subsystem.

Computer memory subsystems have evolved over the years, but continue to retain many consistent attributes. Computer memory subsystems from the early 1980's, such as the one disclosed in U.S. Pat. No. 4,475,194 to LaVallee et al., of common assignment herewith, included a memory controller, a memory assembly (contemporarily called a basic storage module (BSM) by the inventors) with array devices, buffers, terminators and ancillary timing and control functions, as well as several point-to-point busses to permit each memory assembly to communicate with the memory controller via its own point-to-point address and data bus. FIG. 1 depicts an example of this early 1980 computer memory subsystem with two BSMs, a memory controller, a maintenance console, and point-to-point address and data busses connecting the BSMs and the memory controller.

FIG. 2, from U.S. Pat. No. 5,513,135 to Dell et al., of common assignment herewith, depicts an early synchronous memory module, which includes synchronous dynamic random access memories (DRAMs) 8, buffer devices 12, an optimized pinout, an interconnect and a capacitive decoupling method to facilitate operation. The patent also describes the use of clock re-drive on the module, using such devices as phase lock loops (PLLs).

FIG. 3, from U.S. Pat. No. 6,510,100 to Grundon et al., of common assignment herewith, depicts a simplified diagram and description of a memory system 10 that includes up to four registered dual inline memory modules (DIMMs) 40 on a traditional multi-drop stub bus channel. The subsystem includes a memory controller 20, an external clock buffer 30, registered DIMMs 40, an address bus 50, a control bus 60 and a data bus 70 with terminators 95 on the address bus 50 and data bus 70.

FIG. 4 depicts a 1990's memory subsystem which evolved from the structure in FIG. 1 and includes a memory controller 402, one or more high speed point-to-point channels 404, each connected to a bus-to-bus converter chip 406, and each having a synchronous memory interface 408 that enables connection to one or more registered DIMMs 410. In this implementation, the high speed, point-to-point channel 404 operated at twice the DRAM data rate, allowing the bus-to-bus converter chip 406 to operate one or two registered DIMM memory channels at the full DRAM data rate. Each registered DIMM included a PLL, registers, DRAMs, an electrically erasable programmable read-only memory (EEPROM) and terminators, in addition to other passive components.

As shown in FIG. 5, memory subsystems were often constructed with a memory controller connected either to a single memory module, or to two or more memory modules interconnected on a 'stub' bus. FIG. 5 is a simplified example of a multi-drop stub bus memory structure, similar to the one shown in FIG. 3. This structure offers a reasonable tradeoff between cost, performance, reliability and upgrade capability, but has inherent limits on the number of modules that may be attached to the stub bus. The limit on the number of modules that may be attached to the stub bus is directly related to the data rate of the information transferred over the bus. As data rates increase, the number and length of the stubs must be reduced to ensure robust memory operation. Increasing the speed of the bus generally results in a reduction in modules on the bus, with the optimal electrical interface being one in which a single module is directly connected to a single controller, or a point-to-point interface with few, if any, stubs that will result in reflections and impedance discontinuities. As most memory modules are sixty-four or seventy-two bits in data width, this structure also requires a large number of pins to transfer address, command, and data. One hundred and twenty pins are identified in FIG. 5 as being a representative pincount.

FIG. 6, from U.S. Pat. No. 4,723,120 to Petty, of common assignment herewith, is related to the application of a daisy chain structure in a multipoint communication structure that would otherwise require multiple ports, each connected via point-to-point interfaces to separate devices. By adopting a daisy chain structure, the controlling station can be produced with fewer ports (or channels), and each device on the channel can utilize standard upstream and downstream protocols, independent of their location in the daisy chain structure.

FIG. 7 represents a daisy chained memory bus, implemented consistent with the teachings in U.S. Pat. No. 4,723,120. A memory controller 111 is connected to a memory bus 315, which further connects to a module 310a. The information on bus 315 is re-driven by the buffer on module 310a to a next module, 310b, which further re-drives the bus 315 to module positions denoted as 310n. Each module 310a includes a DRAM 311a and a buffer 320a. The bus 315 may be described as having a daisy chain structure with each bus being point-to-point in nature.

As the density and speed of memory subsystems increases, it becomes more difficult to test memory subsystems with standard test devices. In general, there is a lack of low cost industry test capability for very high speed memory assemblies. Existing mainstream memory device and module testers are capable of operating at data rates of about 200 to 500 megabytes per second (Mb/s) with extensions to 1 gigabyte per second (Gb/s) per pin possible on some test systems, and often at a very high cost. Although higher speed testers are expected in the future, they are not expected to keep pace with rapid performance improvements on future memory modules.

Other known testing solutions include using a built in self test (BIST) mode and/or using a transparent mode. BIST is a pre-programmed or programmable sequence and pattern generator, in conjunction with an error checking capability. BIST is implemented in many new designs, but it is limited in test coverage and flexibility due to the die size and power. The programmability is limited due to logic complexity. In addition, timing and voltage adjustments are also limited. Therefore, while BIST is often used for testing memory subsystems, it is often supplemented with other testing methods for thorough test coverage. Transparent mode refers to the capability of having the automated test equipment (ATE) provide address, command, clocks and data at a conventional speed (e.g., 400 Mb/s data) and the memory module passing the information, unmodified and unchecked, to the DRAMs located on the memory module. The use of the transparent mode for testing does not result in testing the memory subsystem at full operating speed.

Based on the lack of available high speed testers and the limited capability of known test features (e.g., BIST, transparent mode), an alternate method of testing that can be utilized to test high speed devices at a relatively low cost would be useful.

BRIEF SUMMARY OF THE INVENTION

Exemplary embodiments of the present invention include a buffer device for testing a memory subsystem. The buffer device includes a parallel bus port adapted for connection to a slow speed bus and a serial bus port adapted for connection to a high speed bus. The high speed bus operates at a faster speed than the slow speed bus. The buffer device also includes a bus converter having a standard operating mode for converting serial packetized input data received via the serial bus port into parallel bus output data for output via the parallel bus port. The buffer device also includes an alternate operating mode for converting parallel bus input data received via the parallel bus port into serial packetized output data for output via the serial bus port. The serial packetized input data is consistent in function and timing to the serial packetized output data.

Additional exemplary embodiments include a method for testing a packetized cascade memory subsystem. The method includes receiving test data at a bus converter. The test data is in a parallel bus data format and received via a slow speed bus. The test data is converted into a serial packetized data format, resulting in converted test data. The converted test data transmitted to the memory subsystem via a high speed bus. The high speed bus operates at a faster speed than the slow speed bus.

Still further exemplary embodiments of the present invention include a storage medium encoded with machine-readable computer program code for testing a packetized cascade memory subsystem, the storage medium including instructions for causing a computer to implement a method. The method includes receiving test data at a bus converter. The test data is in a parallel bus data format and received via a slow speed bus. The test data is converted into a serial packetized data format, resulting in converted test data. The converted test data transmitted to the memory subsystem via a high speed bus. The high speed bus operates at a faster speed than the slow speed bus.

BRIEF DESCRIPTION OF THE DRAWINGS

Referring now to the drawings wherein like elements are numbered alike in the several FIGURES:

FIG. 13 depicts a downstream frame format that is utilized by exemplary embodiments of the present invention;

DETAILED DESCRIPTION OF THE PREFERRED EMBODIMENTS

Exemplary embodiments of the present invention utilize the same buffer devices contained in a packetized cascade memory subsystem for testing the packetized cascade memory subsystem. When used in the packetized cascade memory subsystem in a standard operating mode, a bus converter within the buffer device receives serial packetized data (i.e., in a serial bus packetized data input format) from a high speed bus (e.g., 1.6 Gb/s and 3.2 Gb/s) and converts the data into parallel bus data (i.e., in a parallel bus memory data output format) at a slower speed (e.g., 400 Mb/s and 800 Mb/s) for communicating with memory devices (e.g., SDRAMs and DDR2s). The high speed bus implements a packetized multi-transfer interface. When used in an alternate operating mode for testing, the bus converter within the buffer device converts slower speed parallel bus data (i.e., in a parallel bus memory data input format) received from testing equipment into serial packetized data (i.e., in a serial bus packetized data output format) for transmission on a high speed bus. The serial packetized data is used as input for testing the memory subsystem via the high speed bus. In this manner, test data may be created by standard testing equipment and converted by the buffer device for use in testing a packetized cascade memory subsystem that includes the buffer device and a high speed bus.

Figure 1:
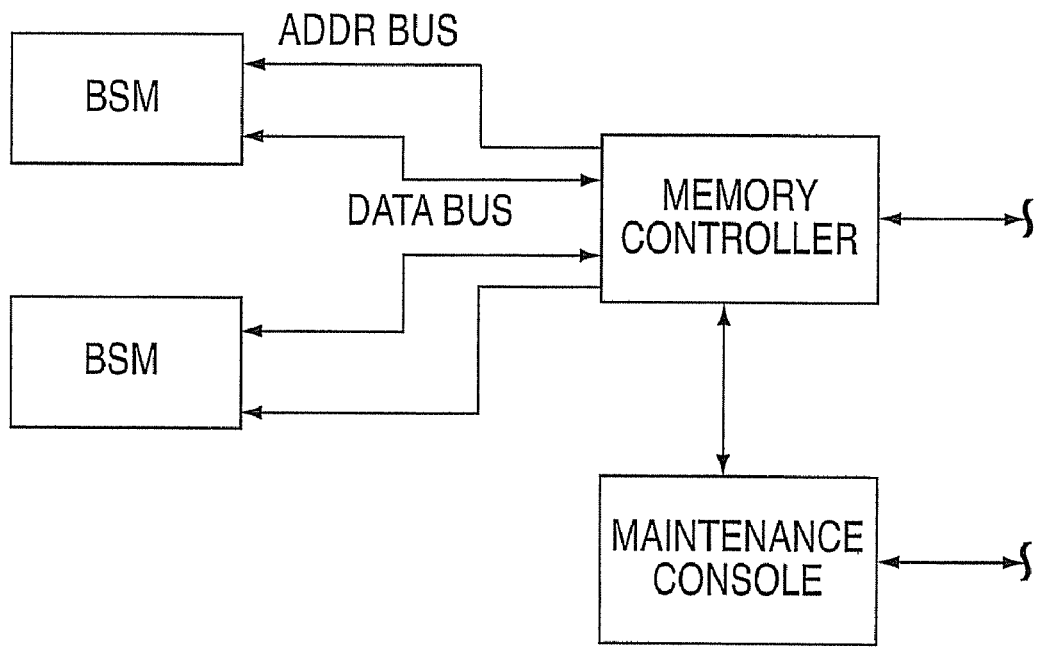
FIG. 1 depicts a prior art memory controller connected to two buffered memory assemblies via separate point-to-point links.
Figure 2:
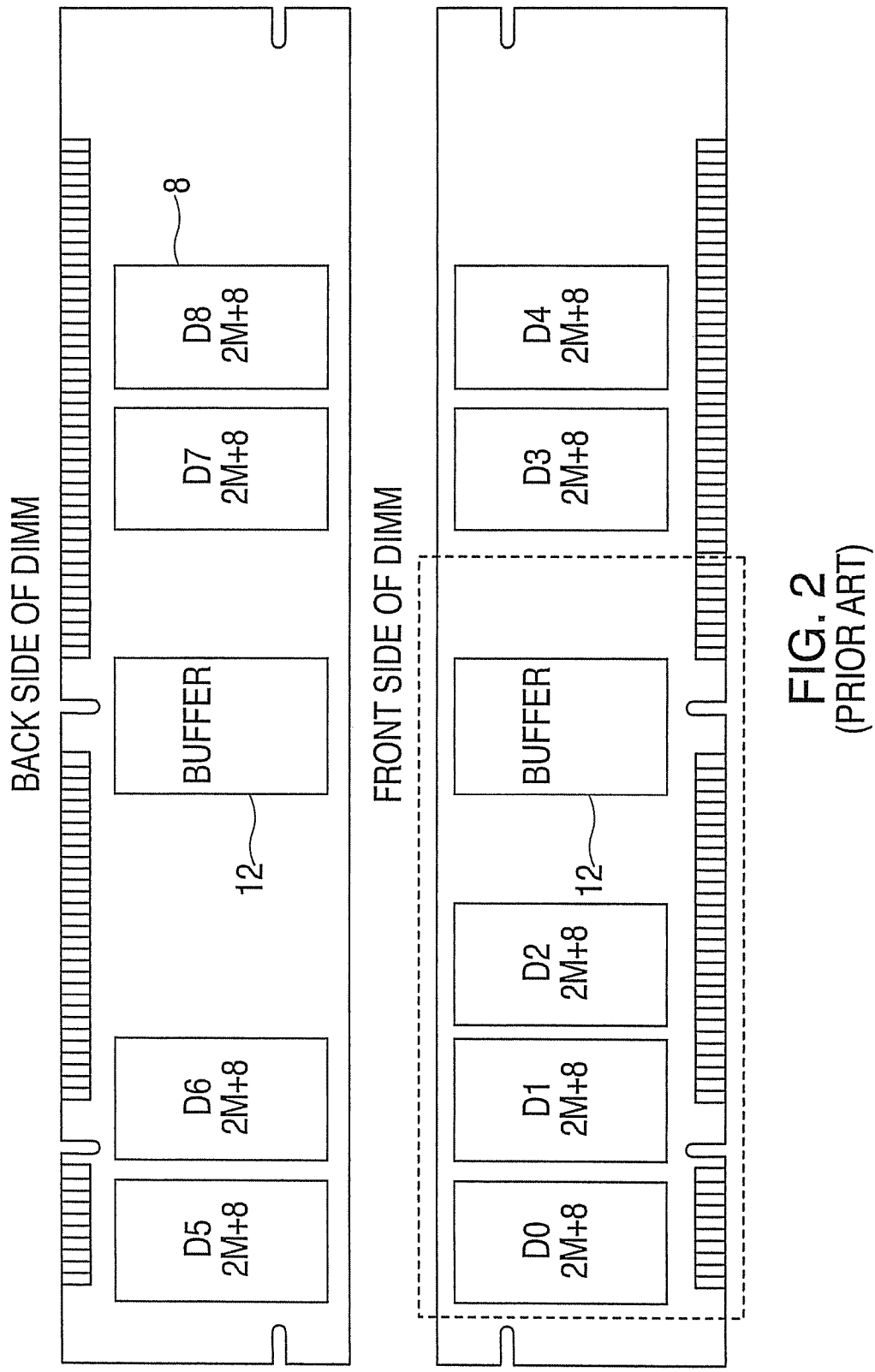
FIG. 2 depicts a prior art synchronous memory module with a buffer device.
Figure 3:
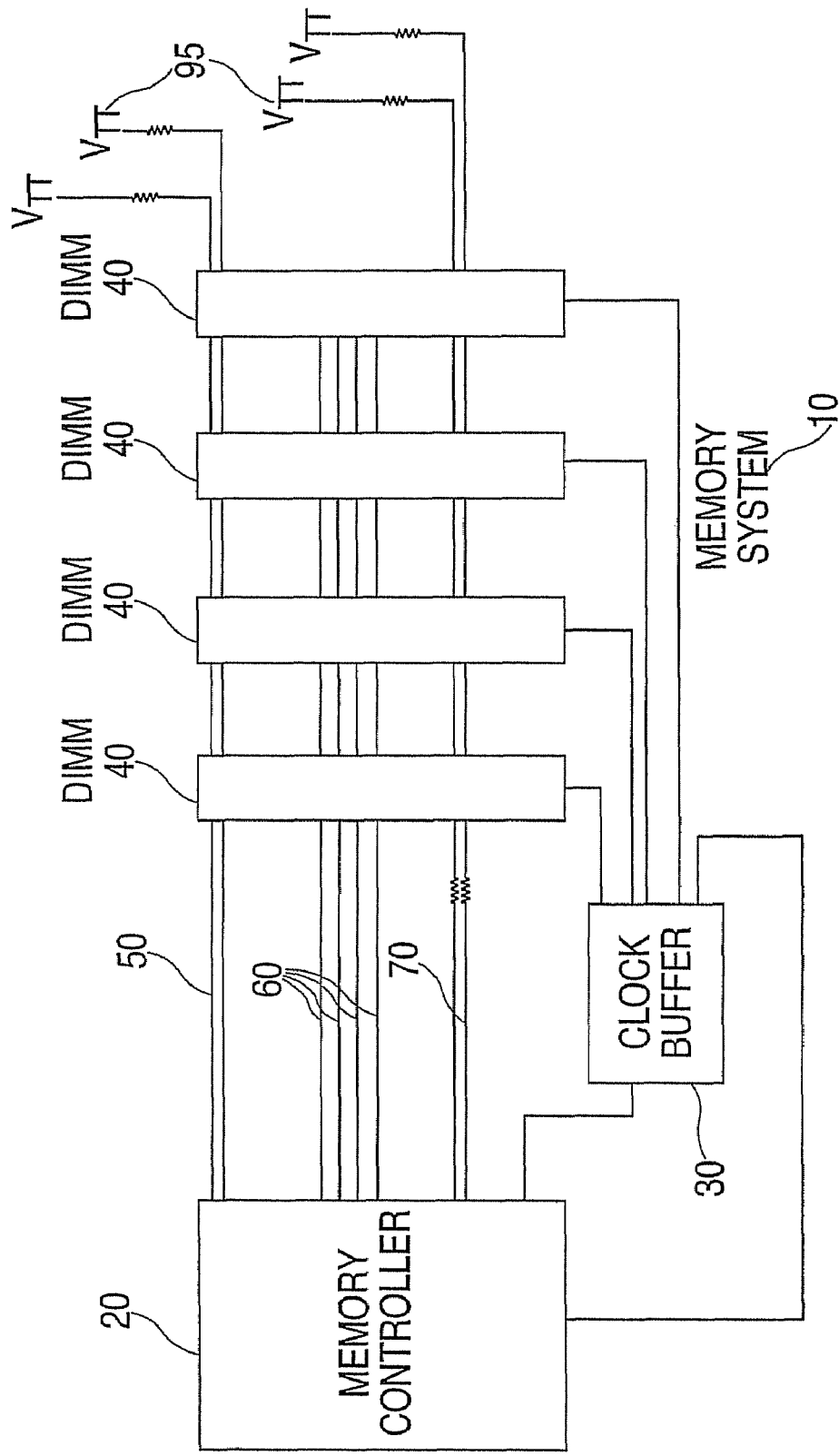
FIG. 3 depicts a prior art memory subsystem using registered DIMMs.
Figure 4:
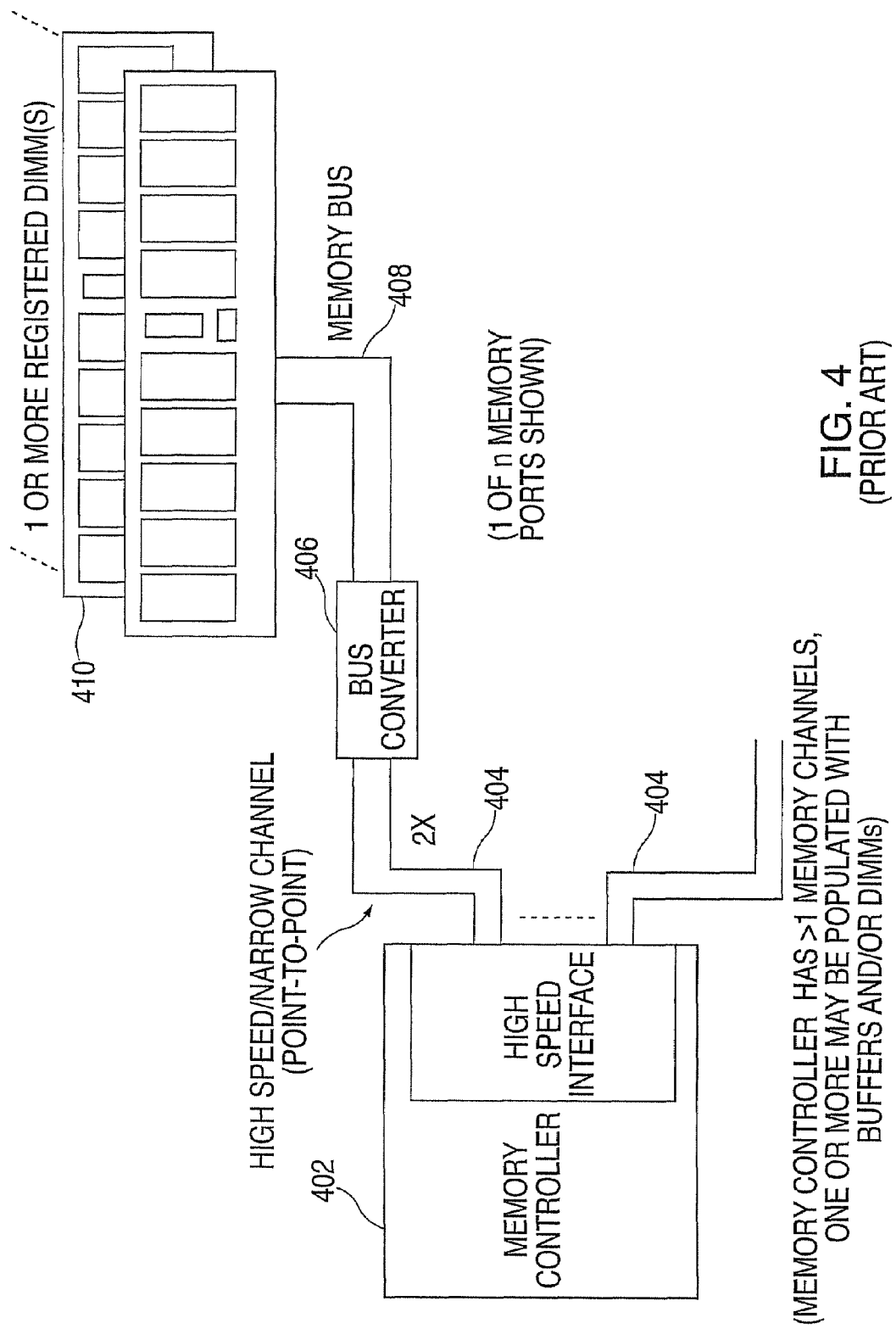
FIG. 4 depicts a prior art memory subsystem with point-to-point channels, registered DIMMs, and a 2:1 bus speed multiplier.
Figure 8:
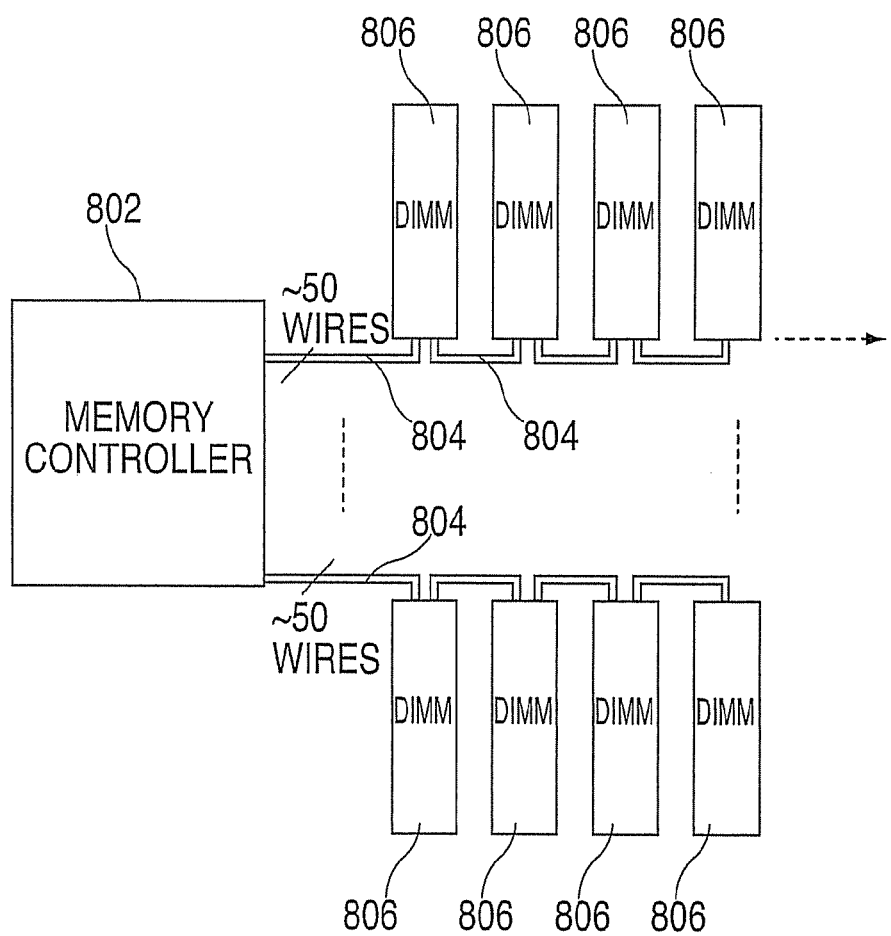
FIG. 8 depicts a cascaded memory structure that is utilized by exemplary embodiments of the present invention.

Exemplary embodiments of the present invention provide a high speed test interface to a memory subsystem, such as the one depicted in FIG. 8. FIG. 8 includes a cascaded memory structure that may be tested using a high speed test interface in accordance with exemplary embodiments of the present invention. It includes buffered memory modules 806 (e.g., the buffer device is included within the memory module 806) that are in communication with a memory controller 802. This memory structure includes the memory controller 802 in communication with one or more memory modules 806 via a high speed point-to-point bus 804. Each bus 804 in the exemplary embodiment depicted in FIG. 8 includes approximately fifty high speed wires for the transfer of address, command, data and clocks. By using point-to-point busses as described in the aforementioned prior art, it is possible to optimize the bus design to permit significantly increased data rates, as well as to reduce the bus pincount by transferring data over multiple cycles. Whereas FIG. 4 depicts a memory subsystem with a two to one ratio between the data rate on any one of the busses connecting the memory controller to one of the bus converters (e.g., to 1,066 Mb/s per pin) versus any one of the busses between the bus converter and one or more memory modules (e.g., to 533 Mb/s per pin), an exemplary embodiment of the present invention, as depicted in FIG. 8, provides a four to one bus speed ratio to maximize bus efficiency and to minimize pincount.

Although point-to-point interconnects permit higher data rates, overall memory subsystem efficiency must be achieved by maintaining a reasonable number of memory modules 806 and memory devices per channel (historically four memory modules with four to thirty-six chips per memory module, but as high as eight memory modules per channel and as few as one memory module per channel). Using a point-to-point bus necessitates a bus re-drive function on each memory module, to permit memory modules to be cascaded such that each memory module is interconnected to other memory modules, as well as to the memory controller 802.

Figure 9:
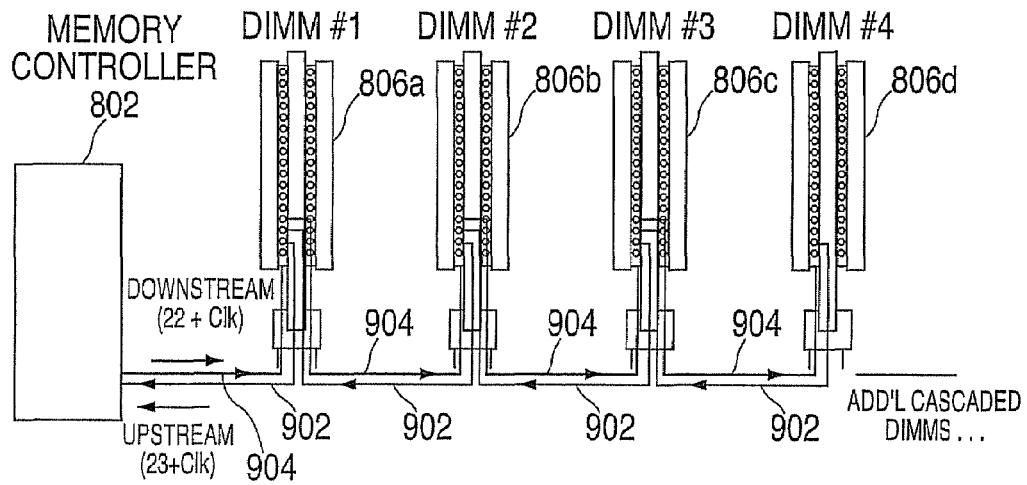
FIG. 9 depicts a memory structure with cascaded memory modules and unidirectional busses that is utilized by exemplary embodiments of the present invention.

FIG. 9 depicts a memory structure with cascaded memory modules and unidirectional busses that may be tested by exemplary embodiments of the present invention. One of the functions provided by the memory modules 806 in the cascade structure is a re-drive function to send signals on the memory bus to other memory modules 806 or to the memory controller 802. FIG. 9 includes the memory controller 802 and four memory modules 806*a*, 806*b*, 806*c* and 806*d*, on each of two memory busses (a downstream memory bus 904 and an upstream memory bus 902), connected to the memory controller 802 in either a direct or cascaded manner. Memory module 806*a* is connected to the memory controller 802 in a direct manner. Memory modules 806*b*, 806*c* and 806*d* are connected to the memory controller 802 in a cascaded manner.

An exemplary memory structure includes two unidirectional busses between the memory controller 802 and memory module 806*a* ("DIMM #1") as well as between each successive memory module 806*b-d* ("DIMM #2", "DIMM #3" and "DIMM #4") in the cascaded memory structure. The downstream memory bus 904 is comprised of twenty-two single-ended signals and a differential clock pair. The downstream memory bus 904 is used to transfer address, control, write data and bus-level error code correction (ECC) bits downstream from the memory controller 802, over several clock cycles, to one or more of the memory modules 806 installed on the cascaded memory channel. The upstream memory bus 902 is comprised of twenty-three single-ended signals and a differential clock pair, and is used to transfer read data and bus-level ECC bits upstream from the sourcing memory module 806 to the memory controller 802. Using this memory structure, and a four to one data rate multiplier between the DRAM data rate (e.g., slow speed or 400 to 800 Mb/s per pin) and the unidirectional memory bus data rate (e.g., high speed or 1.6 to 3.2 Gb/s per pin), the memory controller 802 signal pincount, per memory channel, is reduced from approximately one hundred and twenty pins to about fifty pins.

Figure 10:
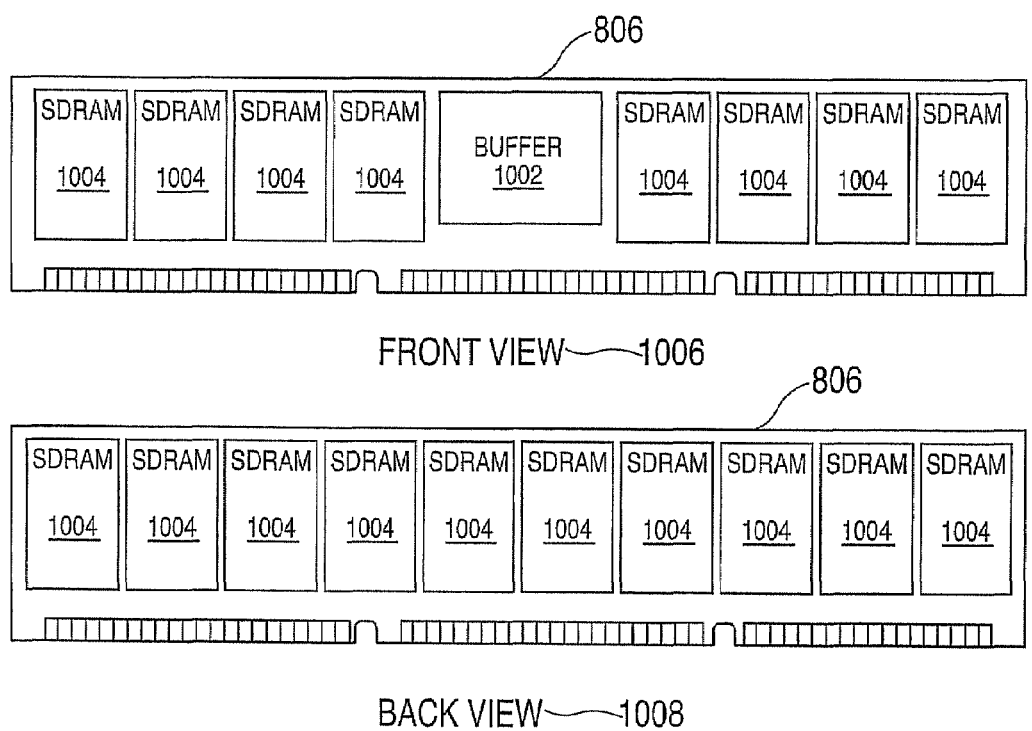
FIG. 10 depicts a buffered memory module that is utilized by exemplary embodiments of the present invention.

FIG. 10 depicts a front view 1006 and a back view 1008 of the buffered memory module 806 that may be tested by exemplary embodiments of the present invention. In exemplary embodiments of the present invention, each memory module 806 includes a blank card having dimensions of approximately six inches long by one and a half inches tall, eighteen DRAM positions, a buffer device 1002, and numerous small components as known in the art that are not shown (e.g., capacitors, resistors, EEPROM.) In an exemplary embodiment of the present invention, the dimension of the card is 151.35 mm long by 30.5 mm tall. In an exemplary embodiment of the present invention, the buffer device 1002 is located in the center region of the front side of the memory module 806, as depicted in the front view 1006 in FIG. 10. Memory devices 1004 (e.g. synchronous DRAMS (SDRAMS)) are located on either side of the buffer device 1002, as well as on the backside of the memory module 806, as depicted in the back view 1008 in FIG. 10. The configuration may be utilized to facilitate high speed wiring to the buffer device 1002, as well as signals from the buffer device to the memory devices 1004.

Figure 11:
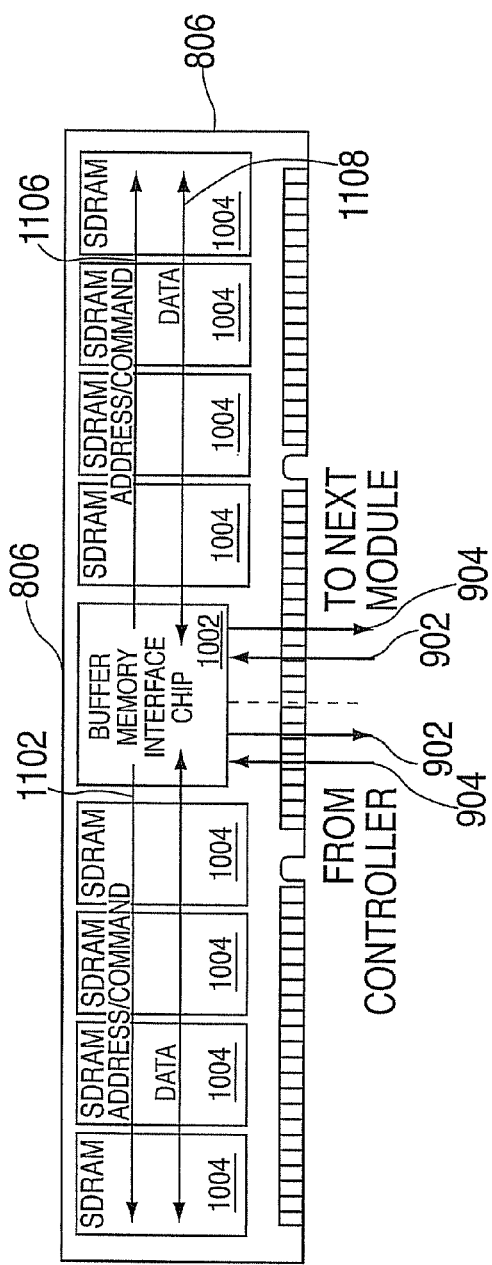
FIG. 11 depicts a buffered module wiring system that is utilized by exemplary embodiments of the present invention.

FIG. 11 depicts a buffered module wiring system that may be tested by utilizing exemplary embodiments of the present invention. In addition, the buffer device 1002 depicted in FIG. 11, running in an alternate operating mode, is utilized as an interface between a testing device and the memory module 806 to perform testing on the memory module 806 in exemplary embodiments of the present invention. FIG. 11 is a pictorial representation of a memory module, with arrows representing the primary signal flows into and out of the buffer device 1002 during the standard operating mode. The signal flows include the upstream memory bus 902, the downstream memory bus 904, memory device address and command busses 1102 and 1106, and memory device data busses 1108 and 1104. In an exemplary embodiment of the present invention, the buffer device 1002, also referred to as a memory interface chip, provides two copies of the address and command signals to the memory devices 1004 with the right memory device address and command bus 1106 exiting from the right side of the buffer device 1002 for the memory devices 1004 located to the right side and behind the buffer device 1002 on the right. A bus converter within the buffer device 1002 converts the high speed memory bus data into slower speed address and command signals for communication with the memory devices 1004. The left memory device address and command bus 1102 exits from the left side of the buffer device 1002 and connects to the memory devices 1004 to the left side and behind the buffer device 1002 on the left. Similarly, the data bits intended for memory devices 1004 to the right of the buffer device 1002 exit from the right of the buffer device 1002 on the right memory device data bus 1108. The data bits intended for the left side of the buffer device 1002 exit from the left of the buffer device 1002 on the left memory device data bus 1104. The high speed upstream memory bus 902 and downstream memory bus 904 exit from the lower portion of the buffer device 1002, and connect to a memory controller or other memory modules either upstream or downstream of this memory module 806, depending on the application. The buffer device 1002 receives signals that are four times the memory module data rate and converts them into signals at the memory module data rate.

The memory controller 802 interfaces to the memory modules 806 via a pair of high speed busses (or channels). The downstream memory bus 904 (outbound from the memory controller 802) interface has twenty-four pins and the upstream memory bus 902 (inbound to the memory controller 802) interface has twenty-five pins. The high speed channels each include a clock pair (differential), a spare bit lane, ECC syndrome bits and the remainder of the bits pass information (based on the operation underway). Due to the cascaded memory structure, all nets are point-to-point, allowing reliable high-speed communication that is independent of the number of memory modules 806 installed. Whenever a memory module 806 receives a packet on either bus, it re-synchronizes the command to the internal clock and re-drives the command to the next memory module 806 in the chain (if one exists).

Figure 12:
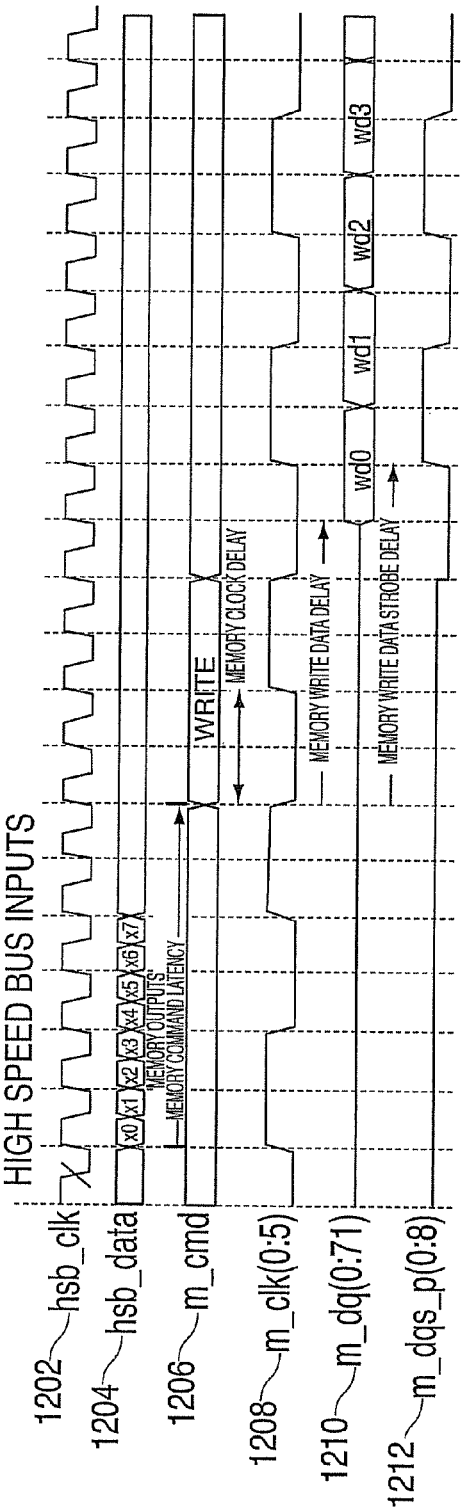
FIG. 12 depicts bus and DRAM timing diagrams showing the four to one bus speed multiplier that is utilized by exemplary embodiments of the present invention.

FIG. 12 depicts bus and SDRAM timing diagrams showing the four to one bus speed multiplier that are utilized by exemplary embodiments of the present invention. As described previously, when being utilized by a packetized cascade memory subsystem, in the standard mode, a bus converter within the buffer device 1002 converts high speed serial packetized data into slower speed parallel data. When being utilized to test a packetized cascade memory subsystem, in the alternate mode, the bus converter within the buffer device 1002 does the opposite; it converts slower speed parallel data into high speed serial packetized data for use as test data. FIG. 12 is a simplified "write" timing diagram that demonstrates the bus timing relationships for a write cycle in the preferred embodiment. The same approach may be taken for other cycles, such as a read cycle. A high speed bus clock (hsb_clk) 1202 is the notation for the positive side of the differential clock that travels with the high speed data traveling downstream from the memory controller 802 to the first memory module 806, or DIMM. Even though the hsb_clk 1202 is shown as being single-ended, in exemplary embodiments of the present invention, a differential clock is utilized to reduce clock sensitivity to external noise and coupling. A high speed data signal (hsb_data) 1204 shows a burst of eight transfers, operating at a double data rate speed (i.e., data is valid on both edges of the clock), which in this example constitutes a single frame of address, command and data to the first memory module 806 position.

Figure 5:
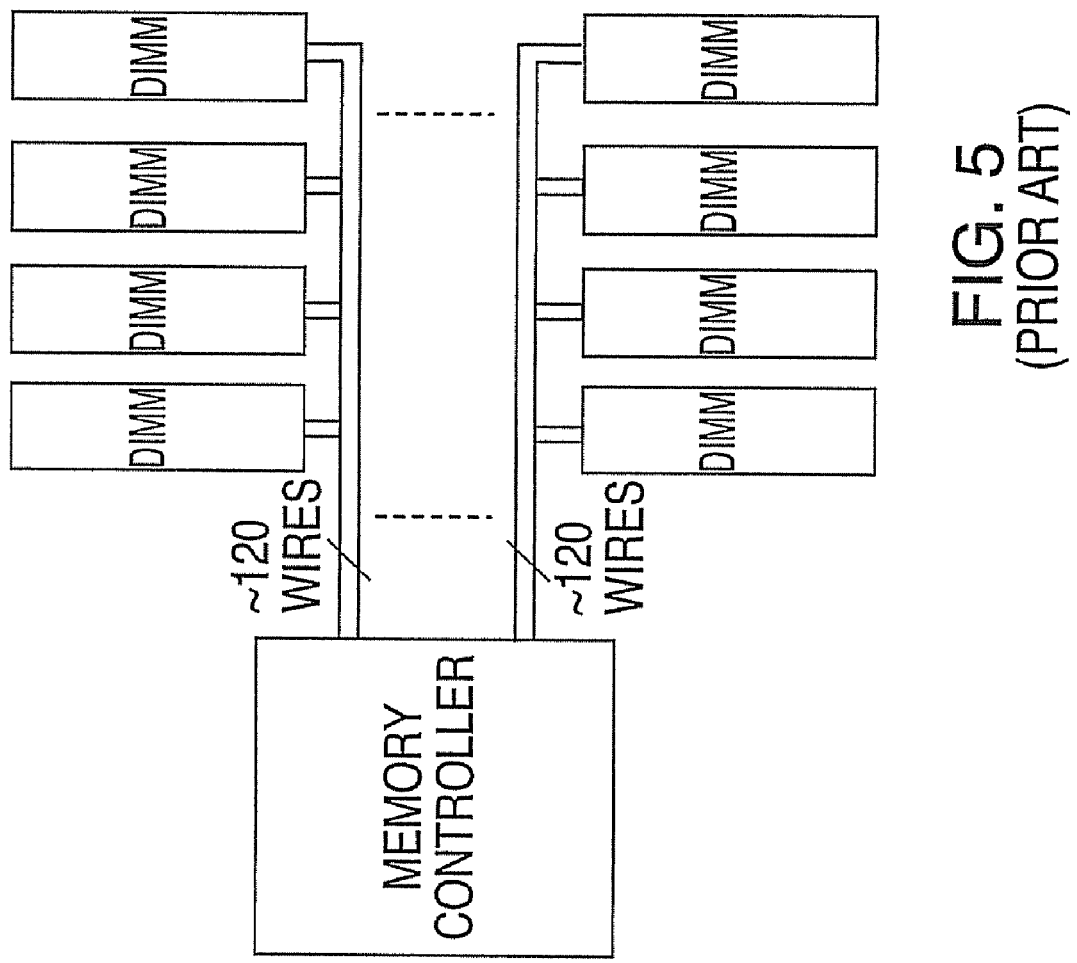
FIG. 5 depicts a prior art memory structure that utilizes a multidrop memory 'stub' bus.
Figure 6:
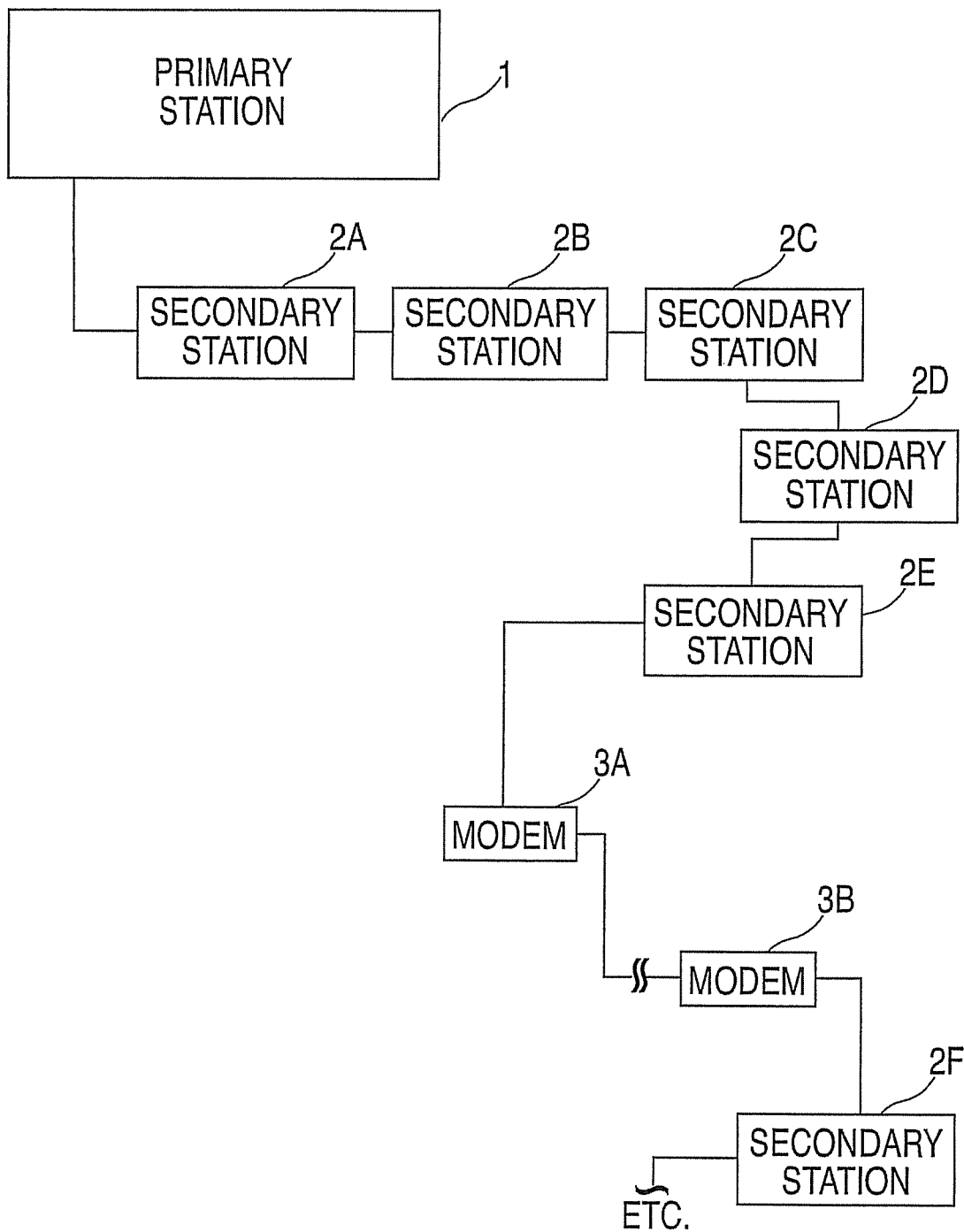
FIG. 6 depicts a prior art daisy chain structure in a multipoint commination structure that would otherwise require multiple ports.
Figure 7:
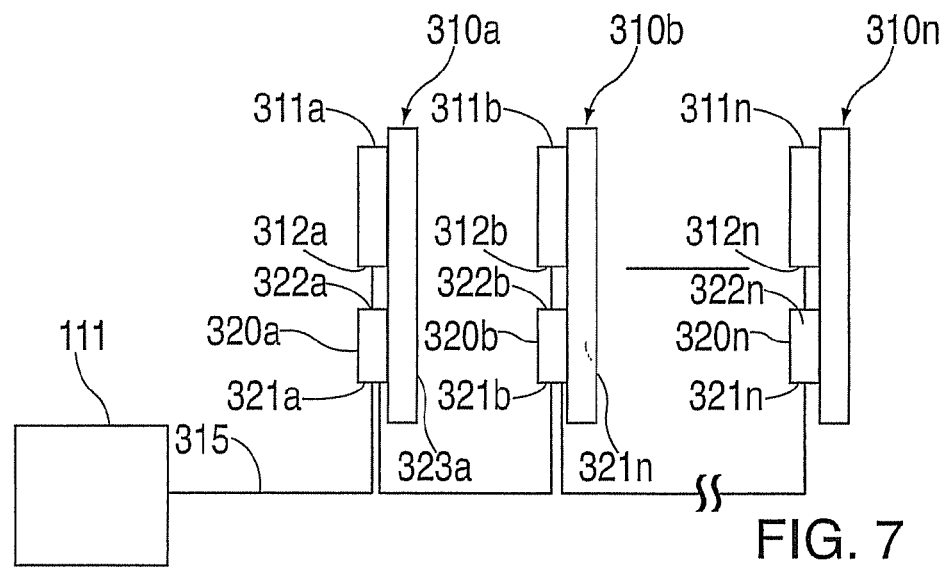
FIG. 7 depicts a prior art daisy chain connection between a memory controller and memory modules.

With the aforementioned downstream bus width of twenty-two bits, and the burst of eight, a full frame can constitute up to one hundred and seventy-six unique bits, depending on the assignment or use of these bits and the actual wires on the bus. This width is more than adequate to provide the approximately one hundred and twenty memory signals defined as being required by the memory module in FIG. 5, thereby enabling additional information to be included in the frame to further enhance overall system reliability, fault survivability and/or performance.

Also as shown in FIG. 12, the eight bits occur over four of the hsb_clk cycle times at which point this example shows no further activity on the high speed bus. A local memory clock (m_clk) 1208 on the memory module 806 is derived from the hsb_clk 1202, and is shown as a single-ended signal m_clk (0:5) operating at one quarter the frequency of the hsb_clk (1202. Although shown as a single-ended clock, in an exemplary embodiment of the present invention, the m_clk 1208 would also operate as a differential clock. The decoded memory command signifying a 'write' operation to double data rate (DDR2) memory devices, or memory devices 1004 on the memory module 806, is shown on the signal labeled m_cmd 1206. This command is decoded from the high speed bus and is driven by the buffer to the DDR2 DRAMS 1004 to ensure arrival at the memory devices 1004 prior to the rising edge of the clock at the memory devices 1004.

The seventy-two bits of data written to the DDR2 memory devices 1004 are shown as m_dq(0:71) 1210, and are shown arriving at the memory devices 1004 one full memory clock after the write command is decoded, as a DDR signal relative to the m_clk 1208. In an exemplary embodiment of the present invention, the data, or m_dq(0:71) 1210 is single ended. The nine DDR data strobes (m_dqs_p) 1212 are also shown, as single ended signals, switching one quarter of a clock cycle prior to the DDR2 SDRAMs 1004, thereby ensuring that the strobe switches approximately in the center of each valid write data bit. In an exemplary embodiment of the present invention, the m_dqs_p 1212 is differential. This diagram demonstrates a burst of four data bits to the memory devices 1004 (wd0 through wd3) with seventy-two bits of memory data being provided to the memory devices every memory clock cycle. In this manner, the data rate of the slower memory modules 806 is matched to the high-speed memory bus that operates at four times the speed of the memory modules.

FIG. 13 depicts a downstream frame format that is utilized by exemplary embodiments of the present invention to transfer information downstream from the memory controller 802 to the memory modules 806. In an exemplary embodiment of the present invention, the downstream frame consists of eight transfers with each transfer including twenty-two signals and a differential clock (twenty-four wires total). The frame further consists of eight command wires (c0 through c7) 1308, nine data wires (di0 through di8) 1306, four bus ECC (Error Correcting Code) wires (ecc0 through ecc3) 1304 and a spare wire (spare) 1302. The seventy-two data bits referenced in the timing diagram of FIG. 12 are shown in FIG. 13 as bits di0 through di8 and consist of nine wires with eight transfers on each wire for each frame. The numbering of each data bit, as well as for other bits, is based on the wire used, as well as the specific transfer. D34 refers to data bit 3 (of bits 0 through 8) and transfer 4 (of transfer 0 through 7).

The command bit field is shown as c0 through c7 and consists of sixty-four bits of information provided to the module over eight transfers. The ECC bit field (ecc0 through ecc3) consists of thirty-two bit positions over eight transfers but is actually formatted in groups of sixteen bits. Each sixteen bit packet consists of four transfers over each of the four wires, and provides the bus level fault detection and correction across each group of 4 bus transfers. The spare bit position may be used to logically replace any of the twenty-one wires, also defined as bitlanes, used to transfer bits in the command, data and ECC fields, should a failure occur in one of those bitlanes that results in errors that exceed a system-assigned failure threshold limit. Using this exemplary embodiment of the present invention provides that out of the one hundred and seventy-six possible bit positions, one hundred and sixty-eight are available for the transfer of information to the memory module 806, and of those one hundred and sixty-eight bit positions, thirty-two bit positions are further assigned to providing ECC protection on the bus transfers themselves, thereby allowing a total of one hundred and thirty-six bit positions to be used for the transfer of information to the memory module 806.

Exemplary embodiments of the present invention include the buffer device 1002 described above including an alternate operating mode to be used in testing high speed cascaded memory subsystems, such as those described above, with a slow speed testing device. As described above, the standard operating mode of the buffer device 1002 includes the receipt, ECC correction and bus conversion from a high speed (e.g., 1.6 Gb/s to 3.2 Gb/s) serial packetized bus to a slower (e.g., 400 to 800 Mb/s) parallel DDR2 memory bus. The alternate operating mode includes having the parallel bus act as the "master" and initiating a bus conversion from the parallel bus to the serial packetized bus when placed in the second operating mode. In the second mode, address, command, clock and data are received on the parallel bus and the buffer device 1002 outputs a properly formatted series of packetized frames which can be used to operate a downstream buffered memory module 806.

Figure 14:
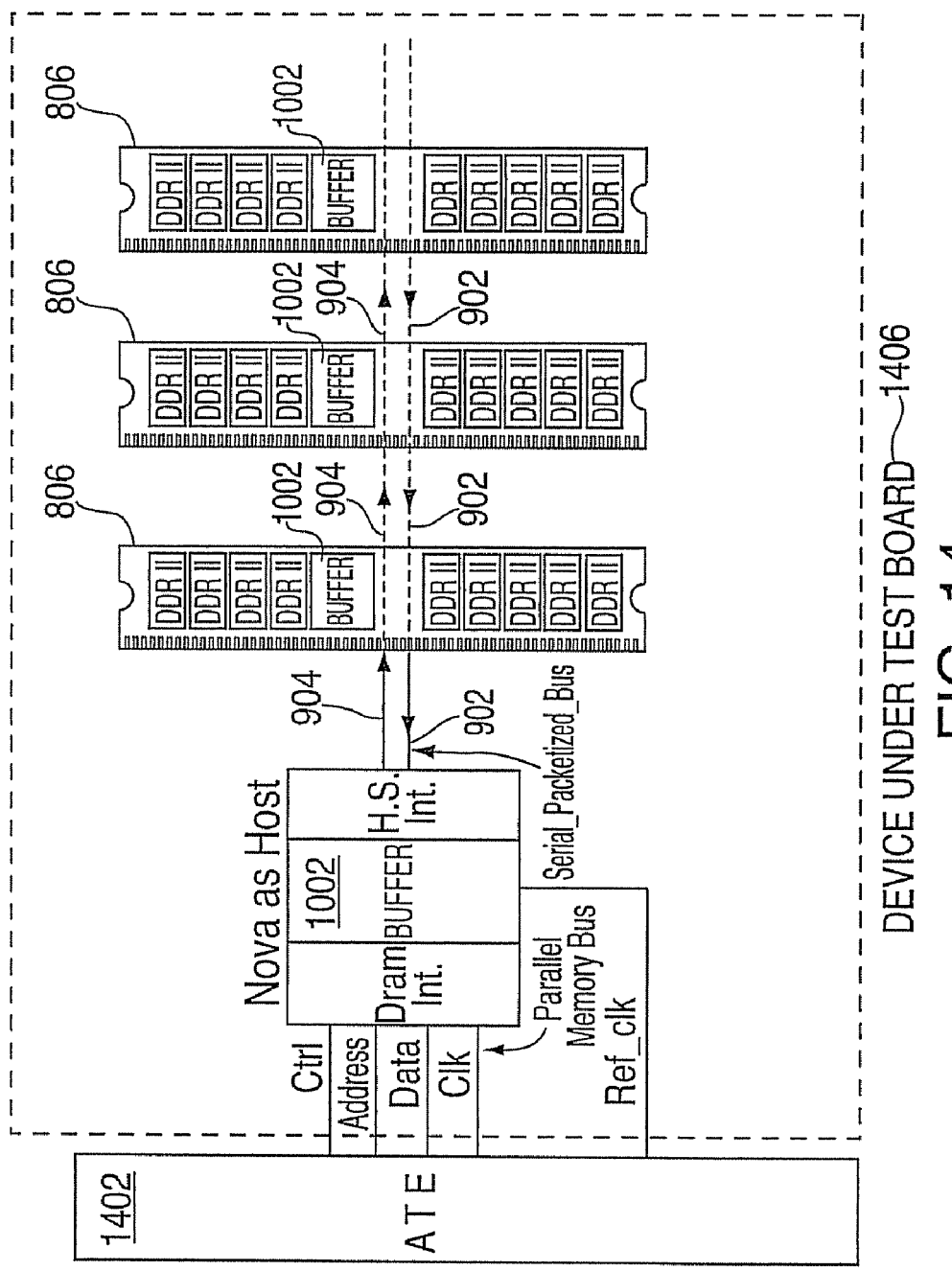
FIG. 14 depicts a buffer device being utilized to convert slow speed signals from an automated test equipment device into packetized high speed signals for testing a memory subsystem in accordance with exemplary embodiments of the present invention.

FIG. 14 depicts the buffer device 1002 being utilized to convert slow speed signals from an ATE device 1402 (i.e., a tester device) into packetized high speed signals for testing a memory subsystem in accordance with exemplary embodiments of the present invention. FIG. 14 depicts the simplest mode of operation, where the buffer device 1002 is placed on an ATE interface board 1406 directly connected to the ATE device 1402 memory interface. In this mode, control signals will be provided to the buffer device 1002 on the control pins (e.g., chip select "CS", clock enable "CKE", on die termination "ODT", column address strobe "CAS", row address strobe "RAS", and write enable "WE"). In addition, address information will be provided in conventional RAS/CAS (two cycle transfer) sequence and data will be provided (for write cycles) in a conventional burst of four or eight (programmable) transfers. The bus converter device within the buffer device 1002 stores and formats the received information, then transmits the information as a high speed eight transfer frame to one or more downstream memory modules 806. With the four to one operating frequency, by operating the memory tester at 533 Mb/s in exemplary embodiments of the present invention, the high speed link can be operated at 2.1 Gb/s.

In FIG. 14, a single memory module 806 is shown to the right of the buffer device 1002 as the memory module 806 under test. In this example, only the upstream side of the memory module 806 is fully tested. The memory module 806 can be fully tested, operating the memory devices 1004 at speed, with and without forced errors. In exemplary embodiments of the present invention other tests may include retention time testing, temperature testing, voltage testing, and other traditional memory tests that would not otherwise be possible without the parallel to serial bus converter functionality. In addition to traditional testing, the memory built in self test (BIST) features can be fully utilized.

Also included in FIG. 14 are additional memory modules 806, connected via dotted lines to the first memory module 806, indicating the possibility to test multiple memory modules 806 on the same channel. Although intensive real time testing may not be possible on all modules simultaneously, using the BIST modes in conjunction with the conventional test modes, a high degree of parallelism can be obtained.

Figure 15:
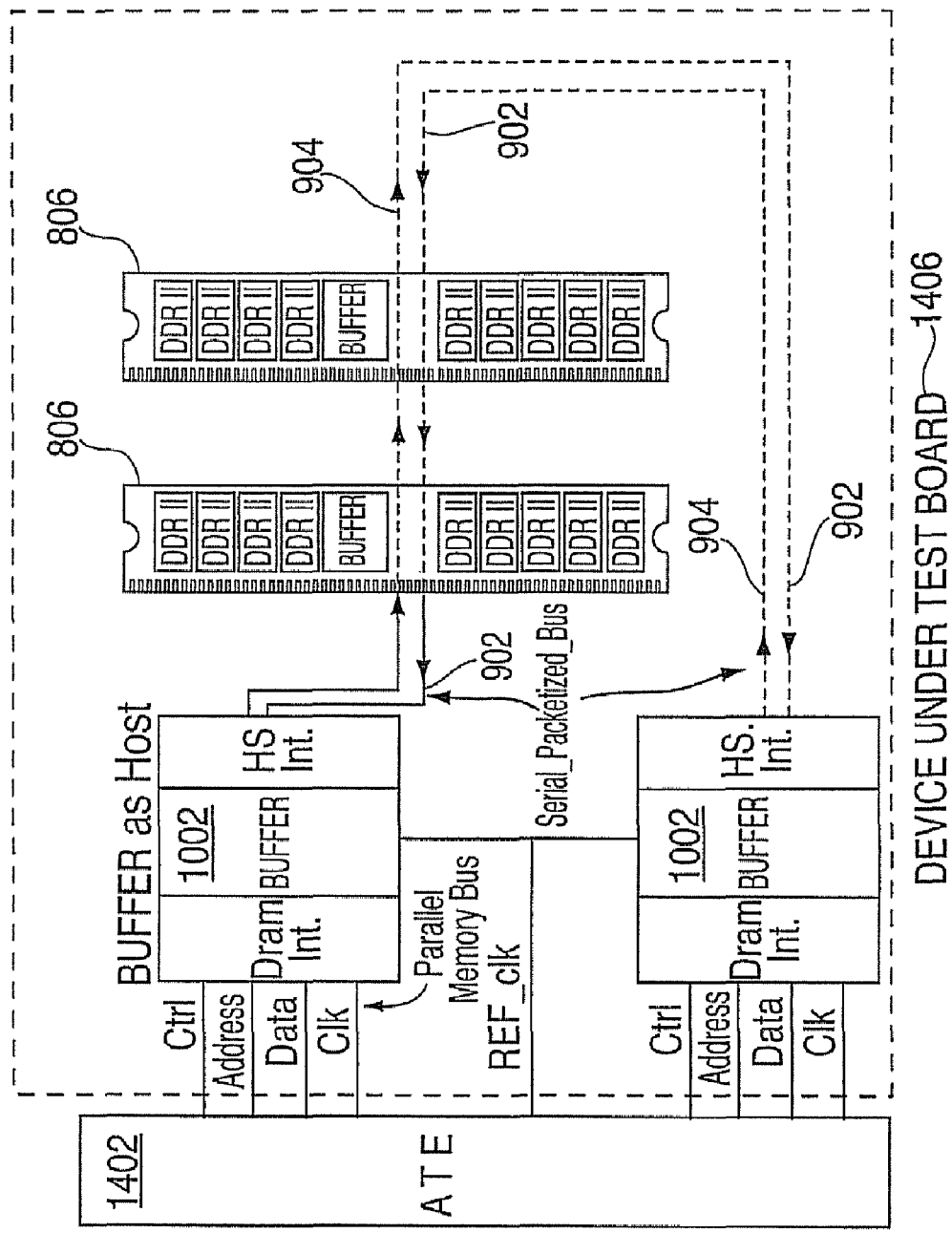
FIG. 15 depicts buffer devices being utilized to convert slow speed signals from an automated test equipment device into packetized high speed signals and back into slow speed signals for input into the automated test equipment device in accordance with exemplary embodiments of the present invention.

FIG. 15 depicts buffer devices 1002 being utilized to convert slow speed signals from the ATE device 1402 into packetized high speed signals and back into slow speed signals for input into the ATE device 1402 in accordance with exemplary embodiments of the present invention. FIG. 15 depicts a test structure that is similar to the one depicted in FIG. 14 with the addition of the buffer device 1002 beyond the last memory module 806 being tested and connected back to the ATE device 1402. This buffer device 1002 can be used to receive signals sent downstream from the ATE device 1402 that have passed through the one or more memory modules 806 under test. In addition, the buffer device 1002 can return these signals to the ATE device 1402 in the conventional parallel configuration and either identical in sequence and timings (delayed only by the transfer time downstream from the tester) to the initially transmitted information, or reconfigured, if desired to an alternate configuration. In addition, the ATE device 1402 can send information (typically data and ECC) upstream through the second buffer device 1002 and the upstream memory modules 806 back to the ATE device 1402 to verify both the integrity of the channel, as well as the full functionality of the final memory module 806 in the cascade channel (i.e., the re-drive and receive and data merge function on the high speed channel).

In addition to using the standard and alternate operating modes in the buffer device 1002 for testing, exemplary embodiments of the present invention allow an enhanced test capability where the buffer device 1002 may be utilized in a stand alone fashion, upstream from the last memory module 806 under test. The buffer device 1002 can forward, on its parallel bus, an exact copy of the information initially sent out by the tester, on the tester parallel bus, to the first parallel to serial bus converter device. The ATE tester device will then be able to compare the information sent out by the tester to the information received by the tester (a pre-defined number of clock counts later) and to determine if any errors have occurred. This capability provides a means of performing low cost bit error testing, of inducing bus errors, of verifying bus error detection, and of permitting full testing of the upstream memory port on the memory module 806 under test at full speed.

In an exemplary embodiment of the present invention, commands and data that have been sent out from the ATE device 1402 will be sent back to the ATE device 1402 via the second buffer device 1002 to verify the integrity of the memory subsystem. For example, a correctable error may be injected and propagated from the ATE device 1402 to the first buffer device 1002 and converted from low speed to packetized high speed. The data with the error is then sent to the first memory module 806 on the downstream memory bus 904. The error is then detected at the buffer device 1002 located on the first memory module 806 (e.g., a status condition is set to indicate an error has been detected) and the data is forwarded on to the second memory module 806. The second memory module 806 also detects an error and logs a status. Eventually, the data with the error arrives back at the second buffer device 1002 and is converted from packetized high speed to low speed. The ATE device 1402 then verifies the command that was originally sent out to the first buffer device 1002.

Figure 16:
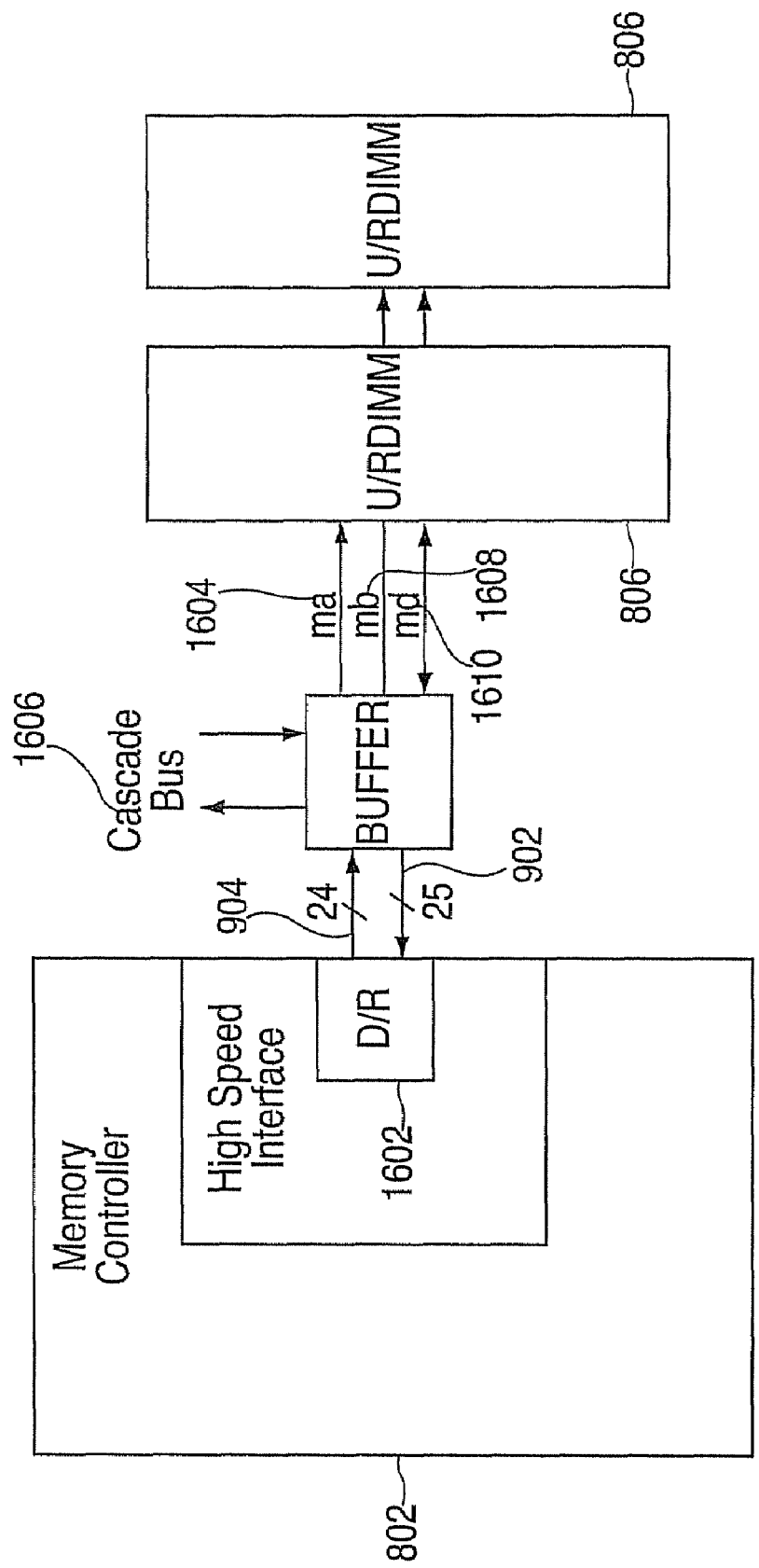
FIG. 16 is a block diagram of a board-mounted buffer device that may be tested by exemplary embodiments of the present invention.

FIG. 16 is a block diagram of a board-mounted multi-mode buffer device 1002 that may be tested by exemplary embodiments of the present invention. FIG. 16 demonstrates the use of the multi-mode buffer device 1002 (the same one discussed previously with regard to buffered memory modules 806) as a board-mounted bus-to-bus converter chip, attached to one or two unbuffered or registered DIMM memory modules 806. The multi-mode buffer device 1002 includes a selection means to adapt the buffer device 1002 for direct attachment to a memory module 806 to enable a buffered memory module mode of operation or to adapt the buffer device 1002 for connection to at least one of an unbuffered memory module and a registered memory module to enable a bus converter mode of operation. The selection means may be implemented in hardware and/or software. In addition a cascade bus 1606 is available from the buffer (or exists on the buffer) and can be connected to a buffered DIMM memory module 806 or via another multi-mode buffer device 1002, to sockets intended for either a second one or two unbuffered or registered DIMM memory modules 806. In this example, the memory a (ma) outputs 1604 are connected to the first DIMM position and the memory b (mb) outputs 1608 are connected to the second DIMM position, and one or both DIMM positions may be populated based on the application requirements. In addition, the memory data (md) 1610 is connected to both memory modules 806 in FIG. 16, generally as a conventional multi-drop net. An upstream receiver functional block and a downstream driver functional block are contained in a driver/receiver functional block 1602 within the memory controller 802. An upstream receiver functional block, an upstream driver functional block, a downstream driver functional block and a downstream receiver functional block are included in the multi-mode buffer device 1002. The upstream memory bus 902 and the downstream memory bus 904 are utilized to transfer data, commands, address and clock data between the memory controller 802 and the multi-mode buffer device 1002.

Figure 17:
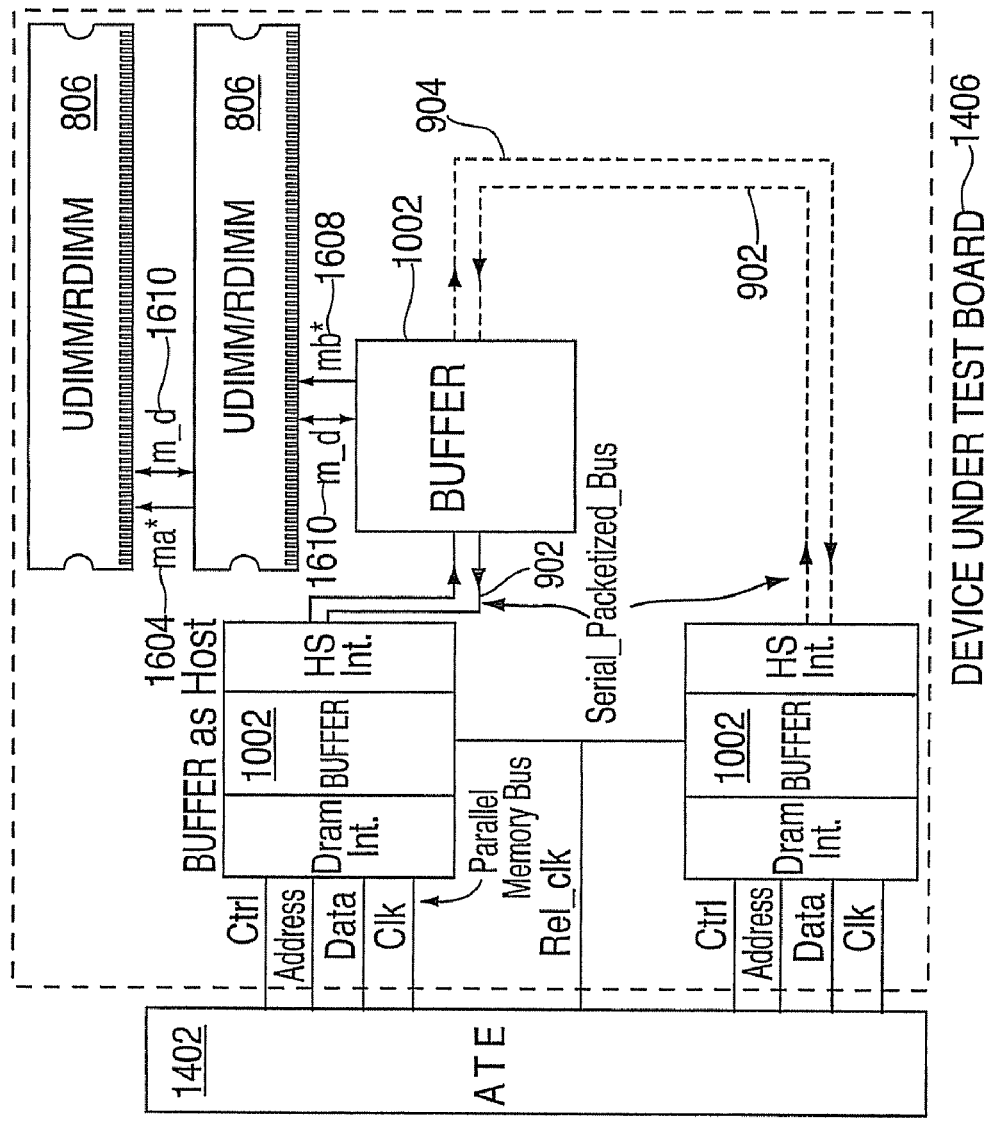
FIG. 17 depicts buffer devices being utilized to test unbuffered memory modules in accordance with exemplary embodiments of the present invention.

FIG. 17 depicts buffer devices being utilized to test the board mounted multi-mode buffer device 1002 depicted in FIG. 16, or alternatively, non-board mounted buffer devices 1002 in accordance with exemplary embodiments of the present invention. In addition to the manufacturing oriented test modes described above, exemplary embodiments of the present invention may be utilized to facilitate early design verification of both buffered memory modules 806 and buffer devices 1002 when used to test unbuffered and/or registered memory modules.

By implementing the logic associated with standard and alternate operating modes of the buffer device 1002 described herein, it is possible to utilize existing ATE devices to fully test memory modules 806, at speed and at a low cost. This capability further reduces the added cost of having a different high speed interface because the buffer devices 1002 with high speed interfaces can be utilized for their own testing. In addition, exemplary embodiments of the present invention may be utilized for testing the cascaded memory subsystems described herein. The operating mode may be selected via software and/or hardware and memory modules may be shipped with both operating modes or with the alternate operating mode disabled. The alternate operating mode would be enabled for users who perform tests on the memory modules.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A buffer device for testing a memory subsystem, the buffer device comprising:
    a parallel bus port adapted for connection to a slow speed bus;
    a serial bus port adapted for connection to a high speed bus, wherein the high speed bus operates at a faster speed than the slow speed bus; and
    a bus converter having a standard operating mode for converting serial packetized input data received via the serial bus port into parallel bus output data for output via the parallel bus port and an alternate operating mode for converting parallel bus input data received via the parallel bus port into serial packetized output data for output via the serial bus port, wherein the serial packetized input data is consistent in function and timing to the serial packetized output data.

2. The buffer device of claim 1 wherein the high speed bus operates at four times the speed of the slow speed bus.

3. The buffer device of claim 1 wherein the slow speed bus operates at a dynamic random access memory (DRAM) data rate.

4. The buffer device of claim 1 wherein the serial packetized output data output via the serial bus port emulates a high speed bus.

5. The buffer device of claim 1 wherein the serial packetized output data for output via the serial bus port emulates a high speed interface for communicating to a buffered memory module.

6. A system comprising:
    a buffer device comprising:
        a parallel bus port adapted for connection to a slow speed bus;
        a serial bus port adapted for connection to a high speed bus, wherein the high speed bus operates at a faster speed than the slow speed bus; and
        a bus converter having a standard operating mode for converting serial packetized input data received via the serial bus port into parallel bus output data for output via the parallel bus port and an alternate operating mode for converting parallel bus input data received via the parallel bus port into serial packetized output data for output via the serial bus port, wherein the serial packetized input data is consistent in function and timing to the serial packetized output data; and
    a tester device adapted for connection to the slow speed bus and including instructions for creating test data and for transmitting the test data as parallel bus input test data to the parallel bus port via the slow speed bus.

7. The system of claim 6 wherein the tester device includes further instructions for receiving test result data responsive to the test data from the buffer device, the receiving via the slow speed bus.

8. A system comprising:
    a buffer device comprising:
        a parallel bus port adapted for connection to a slow speed bus;
        a serial bus port adapted for connection to a high speed bus, wherein the high speed bus operates at a faster speed than the slow speed bus; and
        a bus converter having a standard operating mode for converting serial packetized input data received via the serial bus port into parallel bus output data for output via the parallel bus port and an alternate operating mode for converting parallel bus input data received via the parallel bus port into serial packetized output data for output via the serial bus port, wherein the serial packetized input data is consistent in function and timing to the serial packetized output data; and a buffered memory module adapted for connection to the high speed bus and including instructions for receiving test data as serial packetized output test data from the serial bus port via the high speed bus.

9. The system of claim 8 wherein the buffered memory module includes further instructions for transmitting test result data responsive to the test data to the serial bus port via the high speed bus.

10. The system of claim 8 wherein the buffered memory module includes a memory device and a second bus converter operating in the standard mode for receiving the test data as serial packetized data and for converting the test data into parallel bus data for communication with the memory device.

11. The system of claim 8 wherein the buffered memory module is adapted to be connected to a packetized cascade memory subsystem via a packetized multi-transfer interface.

12. The system of claim 8 wherein the buffered memory module is adapted to be connected to one or more unbuffered memory modules and registered memory modules.

13. The system of claim 12 wherein the buffered memory module and the one or more unbuffered memory modules and registered memory modules are board mounted.

14. A storage medium encoded with machine-readable computer program code for testing a packetized cascade memory subsystem, the storage medium including instructions for causing a computer to implement a method comprising:

receiving test data at a bus converter, the test data in a parallel bus data format and received via a slow speed bus;

converting the test data into a serial packetized data format resulting in converted test data; and transmitting the converted test data to the memory subsystem via a high speed bus, wherein the high speed bus operates at a faster speed than the slow speed bus.

15. The storage medium of claim 14 wherein the high speed bus operates at four times the speed of the slow speed bus.

16. The storage medium of claim 14 wherein the test data is received from a tester device operating at the same speed as the slow speed bus.

17. The storage medium of claim 14 wherein the high speed bus operates at the same speed as the memory subsystem.

18. The storage medium of claim 14 further comprising:

receiving test result data from the memory subsystem via the high speed bus, wherein the test result data is responsive to the test data and is in the serial packetized data format;

converting the test result data into the parallel bus data format resulting in converted test result data; and transmitting the converted test result data to a tester device via the slow speed bus.

19. The storage medium of claim 14 wherein the memory subsystem includes a memory device operating at the speed of the slow speed bus and an other bus converter for receiving the converted test data and for converting the test data into the parallel bus data input format for communication with the memory device.

* * * * *